(12) United States Patent
Fay

(10) Patent No.: US 12,027,498 B2
(45) Date of Patent: Jul. 2, 2024

(54) THREE-DIMENSIONAL STACKING SEMICONDUCTOR ASSEMBLIES WITH NEAR ZERO BOND LINE THICKNESS

(71) Applicant: Micron Technology, Inc., Boise, ID (US)

(72) Inventor: Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/832,019

(22) Filed: Jun. 3, 2022

(65) Prior Publication Data

US 2022/0293569 A1 Sep. 15, 2022

Related U.S. Application Data

(62) Division of application No. 16/774,900, filed on Jan. 28, 2020, now Pat. No. 11,393,791.

(51) Int. Cl.
*H01L 25/065* (2023.01)
*H01L 21/683* (2006.01)
(Continued)

(52) U.S. Cl.
CPC ...... *H01L 25/0657* (2013.01); *H01L 21/6835* (2013.01); *H01L 23/49838* (2013.01); *H01L 23/5226* (2013.01); *H01L 23/528* (2013.01); *H01L 23/53214* (2013.01); *H01L 23/53228* (2013.01); *H01L 24/05* (2013.01); *H01L 24/11* (2013.01); *H01L 24/13* (2013.01);
(Continued)

(58) Field of Classification Search
None
See application file for complete search history.

(56) References Cited

U.S. PATENT DOCUMENTS 5,199,163 A 4/1993 Ehrenberg et al.
5,432,999 A 7/1995 Capps et al.
(Continued)

FOREIGN PATENT DOCUMENTS

TW 201841314 A 11/2018
WO 2018004930 A1 1/2018
WO 2018125213 A1 7/2018

OTHER PUBLICATIONS

International Application No. PCT/US2020/057056—International Search Report and Written Opinion, dated Feb. 5, 2021, 12 pages.
(Continued)

*Primary Examiner* — Long Pham
(74) *Attorney, Agent, or Firm* — Perkins Coie LLP

(57) ABSTRACT

Semiconductor device package assemblies and associated methods are disclosed herein. In some embodiments, the semiconductor device package assembly includes (1) a base component having a front side and a back side opposite the first side, the base component having a first metallization structure at the front side, the first metallization structure being exposed in a contacting area at the front side; (2) a semiconductor device package having a first side and a second side, the semiconductor device package having a second metallization structure at the first side; and (3) a metal bump at least partially positioned in the recess and electrically coupled to the second metallization structure and the first metallization structure.

18 Claims, 23 Drawing Sheets

(51) Int. Cl.
*H01L 23/00* (2006.01)
*H01L 23/498* (2006.01)
*H01L 23/522* (2006.01)
*H01L 23/528* (2006.01)
*H01L 23/532* (2006.01)
*H01L 25/00* (2006.01)

(52) U.S. Cl.
CPC .............. *H01L 24/16* (2013.01); *H01L 24/17* (2013.01); *H01L 24/81* (2013.01); *H01L 25/50* (2013.01); *H01L 2221/68359* (2013.01); *H01L 2224/11462* (2013.01); *H01L 2224/11622* (2013.01); *H01L 2224/13022* (2013.01); *H01L 2224/13109* (2013.01); *H01L 2224/16145* (2013.01); *H01L 2224/17181* (2013.01); *H01L 2225/06513* (2013.01); *H01L 2225/06544* (2013.01); *H01L 2225/06565* (2013.01); *H01L 2225/06586* (2013.01); *H01L 2924/1431* (2013.01); *H01L 2924/1434* (2013.01)

(56) References Cited

U.S. PATENT DOCUMENTS

| | | | |
|---|---|---|---|
| 6,873,054 B2 | 3/2005 | Miyazawa et al. | |
| 8,202,797 B2* | 6/2012 | Chi | H01L 21/568 |
| | | | 257/737 |
| 8,324,736 B2* | 12/2012 | Kawashita | H01L 21/76898 |
| | | | 257/E23.008 |
| 9,129,963 B1 | 9/2015 | Yang | |
| 10,186,499 B2 | 1/2019 | Seidemann et al. | |
| 2008/0237881 A1 | 10/2008 | Dambrauskas et al. | |
| 2009/0014843 A1* | 1/2009 | Kawashita | H01L 21/6835 |
| | | | 438/109 |
| 2011/0233773 A1* | 9/2011 | Kawashita | H01L 25/50 |
| | | | 257/737 |
| 2011/0309492 A1 | 12/2011 | Chi et al. | |
| 2012/0108055 A1* | 5/2012 | Yoshimura | H01L 21/6835 |
| | | | 257/E21.597 |
| 2019/0238134 A1 | 8/2019 | Lee et al. | |
| 2019/0287956 A1 | 9/2019 | Raorane et al. | |
| 2020/0203313 A1 | 6/2020 | Chen et al. | |
| 2020/0395337 A1* | 12/2020 | Fay | H01L 25/0657 |
| 2021/0233894 A1 | 7/2021 | Fay | |

OTHER PUBLICATIONS

TW Patent Application No. 109138553—Taiwanese Search Report, dated Apr. 28, 2021, with English Translation, 2 pages.

* cited by examiner

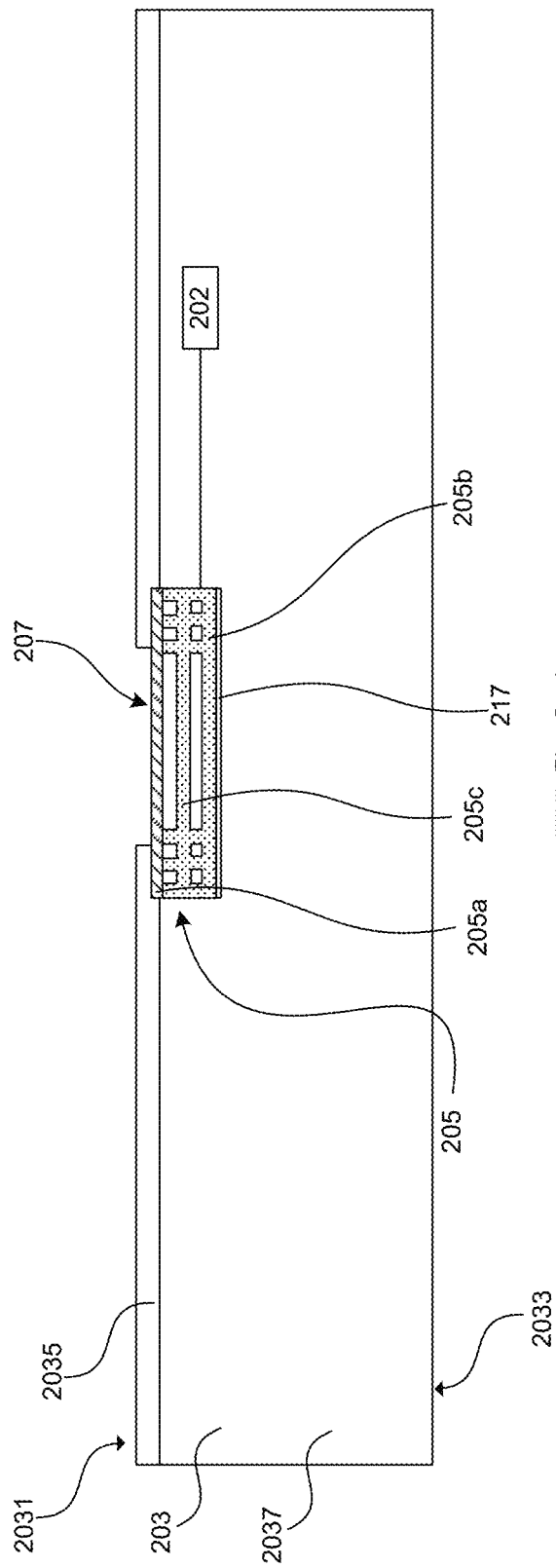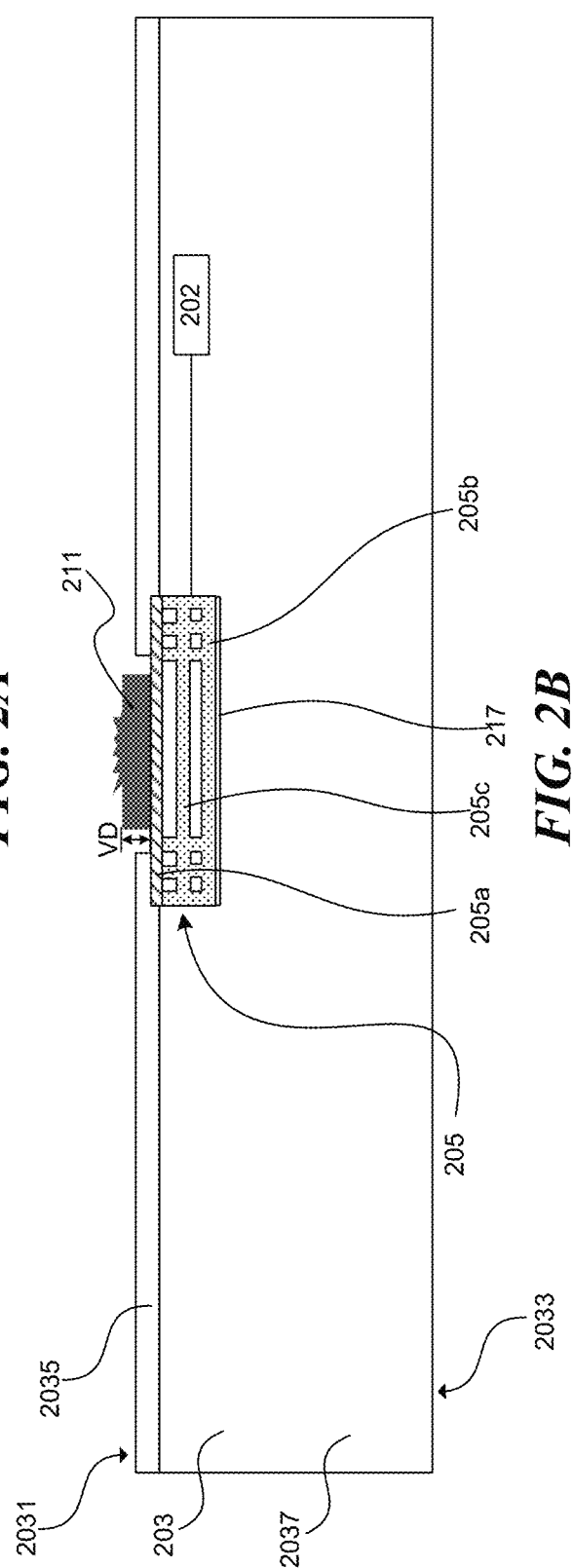

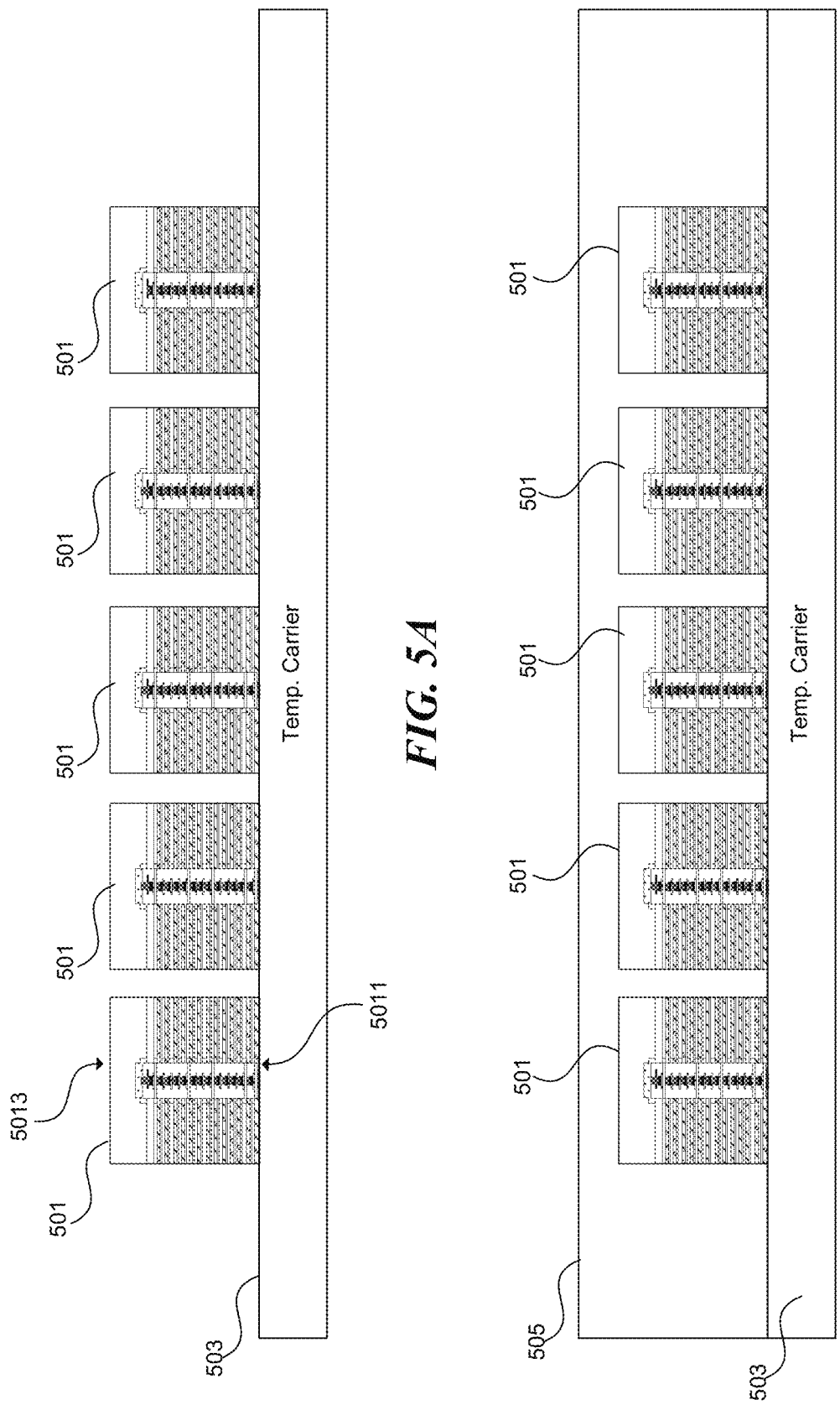

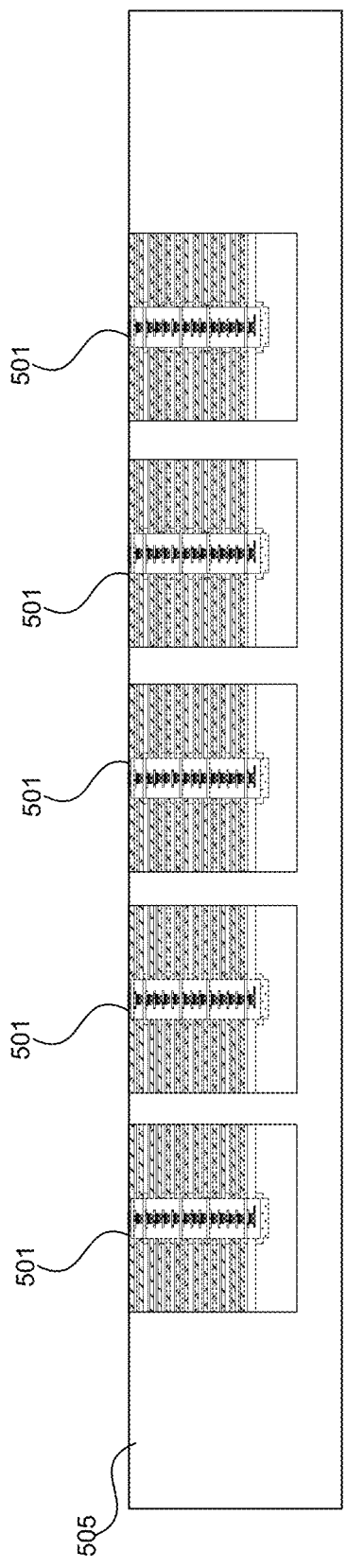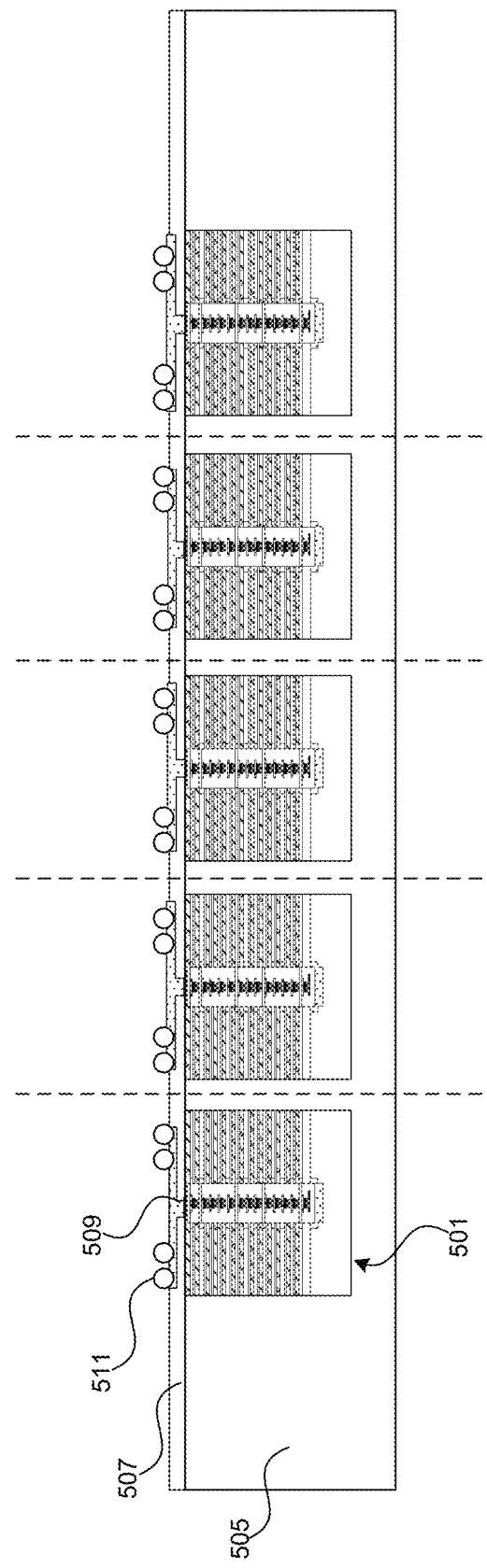

THREE-DIMENSIONAL STACKING SEMICONDUCTOR ASSEMBLIES WITH NEAR ZERO BOND LINE THICKNESS

CROSS-REFERENCE TO RELATED APPLICATION(S)

This application is a division of U.S. application Ser. No. 16/774,900, filed Jan. 28, 2020, which is incorporated herein by reference in its entirety.

TECHNICAL FIELD

The present technology is directed to semiconductor assemblies having stackable semiconductor packages therein. More particularly, some embodiments of the present technology relate to semiconductor assemblies manufactured by a three-dimensional stacking (3DS) process. In such embodiments, the semiconductor packages are directly, electrically coupled to one another with negligible (e.g., near zero) bond line thickness (BLT) and without using through-silicon vias (TSVs).

BACKGROUND

Packaged semiconductor dies, including memory chips, microprocessor chips, logic chips and imager chips, typically include a semiconductor die mounted on a substrate and encased in a plastic protective covering. Individual semiconductor die can include functional features, such as memory cells, processor circuits, imager devices and other circuitry, as well as bond pads electrically connected to the functional features. Semiconductor manufacturers continually reduce the size of die packages to fit within the space constraints of electronic devices. One approach for increasing the processing power of a semiconductor package is to vertically stack multiple semiconductor dies on top of one another in a single package. The dies in such vertically-stacked packages can be electrically interconnected by using TSVs, which require multiple processing steps, such as photolithography, to construct.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

FIGS. 2A-2J are schematic cross-sectional views illustrating a method of forming a semiconductor device package in accordance with the present technology.

FIGS. 5A-5D are schematic cross-sectional views illustrating a method of processing multiple semiconductor device package assemblies in accordance with the present technology.

DETAILED DESCRIPTION

Specific details of several embodiments of stacked semiconductor die packages and methods of manufacturing such die packages are described below. The term "semiconductor device" generally refers to a solid-state device that includes one or more semiconductor materials. A semiconductor device can include, for example, a semiconductor substrate or wafer, or a die that is singulated from a wafer or substrate. Throughout the disclosure, semiconductor dies are generally described in the context of semiconductor devices but are not limited thereto.

The term "semiconductor device package" can refer to an arrangement with one or more semiconductor devices incorporated into a common package. A semiconductor package can include a housing or casing that partially or completely encapsulates at least one semiconductor device. The term "semiconductor device package assembly" can refer to an assembly that includes multiple stacked semiconductor device packages. As used herein, the terms "vertical," "lateral," "upper," and "lower" can refer to relative directions or positions of features in the semiconductor device or package in view of the orientation shown in the Figures. These terms, however, should be construed to include semiconductor devices having other orientations, such as inverted or inclined orientations.

Figure 1:
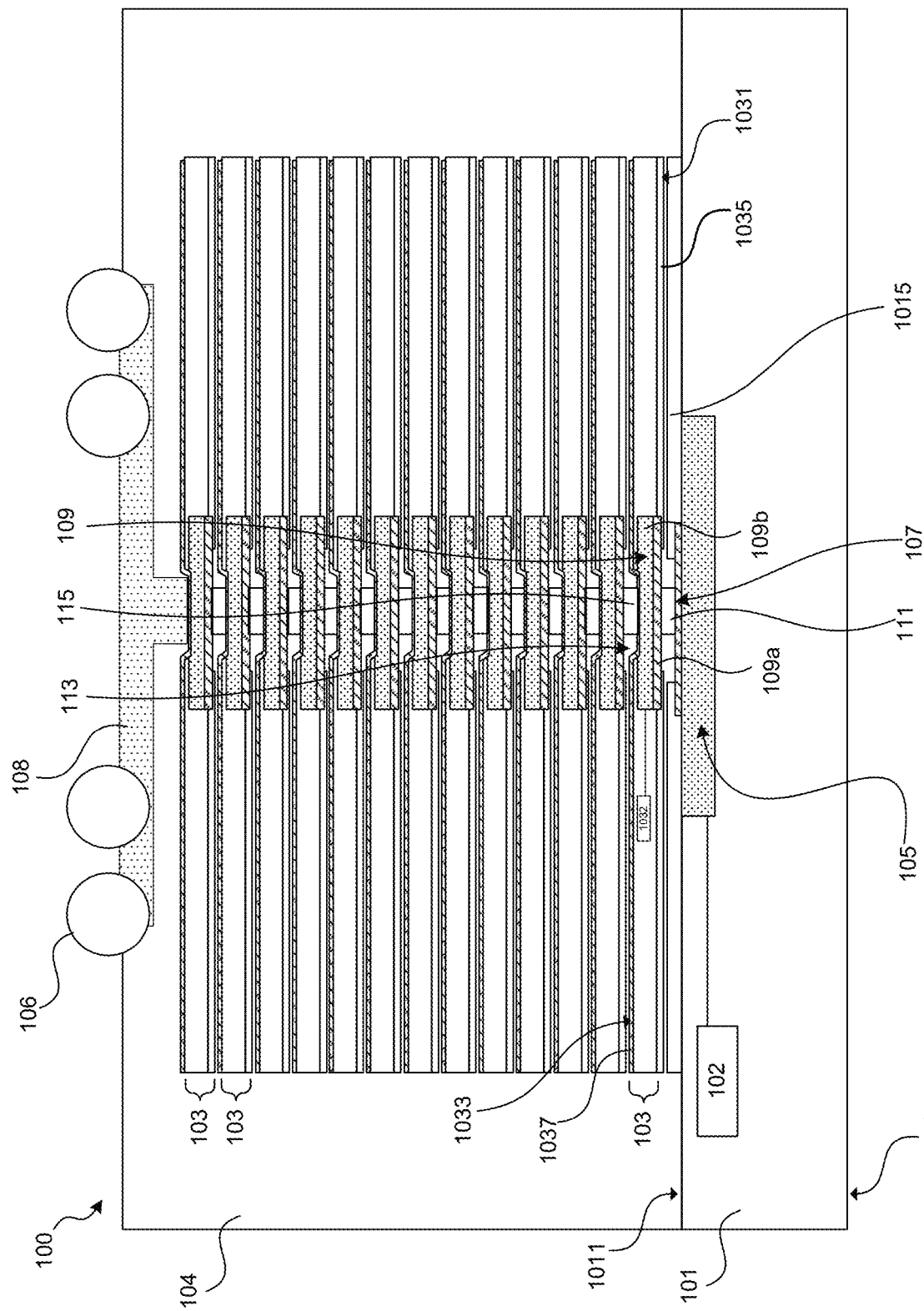
FIG. 1 is a schematic cross-sectional view of a semiconductor device package assembly in accordance with the present technology.

FIG. 1 is a schematic cross-sectional view of a semiconductor device package assembly 100 in accordance with an embodiment of the present technology. As shown, the semiconductor device package assembly 100 includes a base component 101 and multiple semiconductor device packages 103 stacked on the base component 101. Although the illustrated embodiment shows thirteen (13) separate, stacked semiconductor device packages 103, it will be appreciated that the semiconductor device package assembly 100 can include any suitable number (e.g., 10, 12, 14, 16, 18, etc.) of stacked semiconductor device packages 103 in other embodiments. The semiconductor device package assembly 100 includes an encapsulant material 104 covering the base component 101 and the semiconductor device packages 103. In some embodiments, the encapsulant material 104 can include resin, plastic, silicon, oxide, polymer, or other suitable dielectric materials.

As shown in FIG. 1, the semiconductor device packages 103 are electrically coupled to electric couplers 106 via a metallization structure 108. In some embodiments, the electric couplers 106 can include solder bumps, solder balls, conductive pads, and/or other suitable devices. The metallization structure 108 can include conductive materials, such as metal (e.g., copper), configured into traces, vias, planes, etc., that define a circuitry which electrically connects the semiconductor device packages 103 to the electric couplers 106. By this arrangement, the base component 101 and the semiconductor device packages 103 can be electrically coupled to an external device via the electric couplers 106 and the metallization structure 108.

The semiconductor device package assembly 100 has a vertically compact design. For example, the base component 101 and the multiple semiconductor device packages 103 are directly stacked together such that a Bond Line Thickness (BLT) between the multiple semiconductor device packages 103 can be zero or near zero. In some embodiments, the BLT between the base component 101 and the adjacent semiconductor device package 103 can also be zero or near zero.

In some embodiments, the base component 101 can include one or more semiconductor components 102 (e.g., integrated circuitry) therein. The base component 101 can be a circuit board or other type of substrate commonly used in semiconductor device packages or the base component can be a semiconductor device, such as a logic device, memory device, or processor. As shown, the base component 101 has a first side 1011 (e.g., a front/active side) and a second side 1013 (e.g., a back/inactive side) opposite the first side 1011.

The base component 101 can include a passivation layer 1015 at the first side 1011 of the base component 101. In some embodiments, the passivation layer 1015 can include an oxide layer, an inert layer (e.g., a layer that is less likely to chemically react with air or corrode), or other suitable protective layers. The passivation layer 1015, for example, can include a protective film. The passivation layer 1015 protects the base component 101. In some embodiments, the base component 101 can be further coupled to an interposer substrate by electric couplers such as solder bumps or solder balls.

As shown, the base component 101 includes a metallization structure 105 electrically coupled to the semiconductor components 102 in the base component 101. In the illustrated embodiments, the metallization structure 105 can include one or more metallization layers defining traces, vias and/or planes. In some embodiments, the metallization layers can include aluminum (e.g., an aluminum pad), copper, or other suitable metal or conductive materials.

In the illustrated embodiments, the metallization structure 105 can be formed during a back-end-of-line (BEOL) manufacturing process. The metallization structure 105 can include a contacting area 107 configured to be in contact with the lowermost semiconductor device package 103 (e.g., electrically and physically) when the semiconductor device package 103 is stacked on the base substrate 101.

In the illustrated embodiments shown in FIG. 1, individual semiconductor device packages 103 have a first side 1031 (e.g., a front/active/face side) and a second side 1033 (e.g., a back/inactive side) opposite to the first side 1031. As shown, the individual semiconductor device packages 103 also can include a passivation layer 1035 at the first side 1031 of the semiconductor device package 103 to protect the semiconductor device package 103. In some embodiments, the passivation layer 1035 can include an oxide layer, an inert layer (e.g., a layer that is less likely to chemically react with air or corrode), or other suitable protective layers. The passivation layer 1035 can alternatively be a pre-formed protective film.

As shown, the individual semiconductor device packages 103 can also include a dielectric layer 1037 at the second side 1033 of the semiconductor device package 103 to protect the semiconductor device package 103. In some embodiments, the dielectric layer 1037 can be a dielectric film.

The individual semiconductor device packages 103 can also include a metallization structure 109 electrically coupled to one or more semiconductor components 1032 (e.g., integrated circuitry, etc.) in the semiconductor device package 103. The metallization structure 109 can extend through the thickness of the semiconductor device package 103. The metallization structure 109 can include layers of aluminum, copper, or other suitable metals or conductive materials. The metallization structure 109 can be formed during a BEOL manufacturing process and include multiple layers of traces, vias or other electrical features. The metallization structure 109 can have a conductive pad 109a at the first side 1031 and a contacting region 109b at the back side 1033.

As shown in FIG. 1, the base component 101 and the lowermost semiconductor device package 103 are stacked in a "face-to-face" manner such that the first side 1011 (e.g., "face" side) of the base component 101 faces the first side 1031 (e.g., "face" side) of the lowermost semiconductor device package 103. The passivation layer 1035 on the lowermost semiconductor device package 103 can directly contact the passivation layer 1015 on the base component 101 such that there is zero BLT between the lowermost semiconductor device package 103 and the base component 101. However, a very small gap may exist between the lowermost semiconductor device package 103 and the base component 101 such that there is near zero BLT in some embodiments. As also shown in FIG. 1, additional semiconductor device packages 103 are stacked above the lowermost semiconductor device package 103 in a "face-to-back" manner. For example, the second side 1033 ("back" side) of one semiconductor device package 103 is directly coupled to the first side 1031 ("face" side) of an adjacent semiconductor device package 103. By this arrangement, the base component 101 and the semiconductor device packages 103 can be quickly stacked. The semiconductor device package assembly 100 can have more device density as more semiconductor device packages 103 are stacked on each other.

The semiconductor device package assembly 100 further includes metal bumps 111 (or metal pillars) at the first side 1031 of the lowermost semiconductor device package 103. The metal bumps 111 are electrically coupled to the metallization structure 109 of the lowermost semiconductor device package 103 and to the metallization structure 105 of the base component 101 (e.g., at the contacting area 107). The metal bumps 111 can be made from indium or other suitable conductive materials. In some embodiments, the metal bumps 111 can be electrically coupled to the first metallization layer 105 of the base component 101 by an annealing process, such as heating the metal bumps 111 at 100-200 degrees Celsius for a period of time.

The individual semiconductor device packages 103 have a recess 113 (e.g., a "divot" or "trench") at their second side 1033, and metal bumps 115 (or metal pillars) can be positioned in the recesses 113. The metal bumps 115 can be electrically coupled to the metallization structures 109 of adjacent semiconductor device packages 103. By this arrangement, the present technology enables the base component 101 to be electrically coupled to the semiconductor device packages 103 without using TSVs in either the base component 101 or the semiconductor device packages 103. In some embodiments, the metal bumps 115 can be electrically coupled to the semiconductor device packages 103 by an annealing process, such as heating the metal bumps 115 to about 100-300 degrees Celsius (e.g., 200° C.) for about 50-200 seconds (e.g., 100 seconds).

In some embodiments, the semiconductor device package assembly 100 can be a memory device in which the semiconductor device packages 103 are memory dies (e.g., DRAM, LPDRAM, SRAM, Flash, etc.). In some embodiments, the base component 101 can be a logic device, processor, and/or another memory device.

Figure 2C:
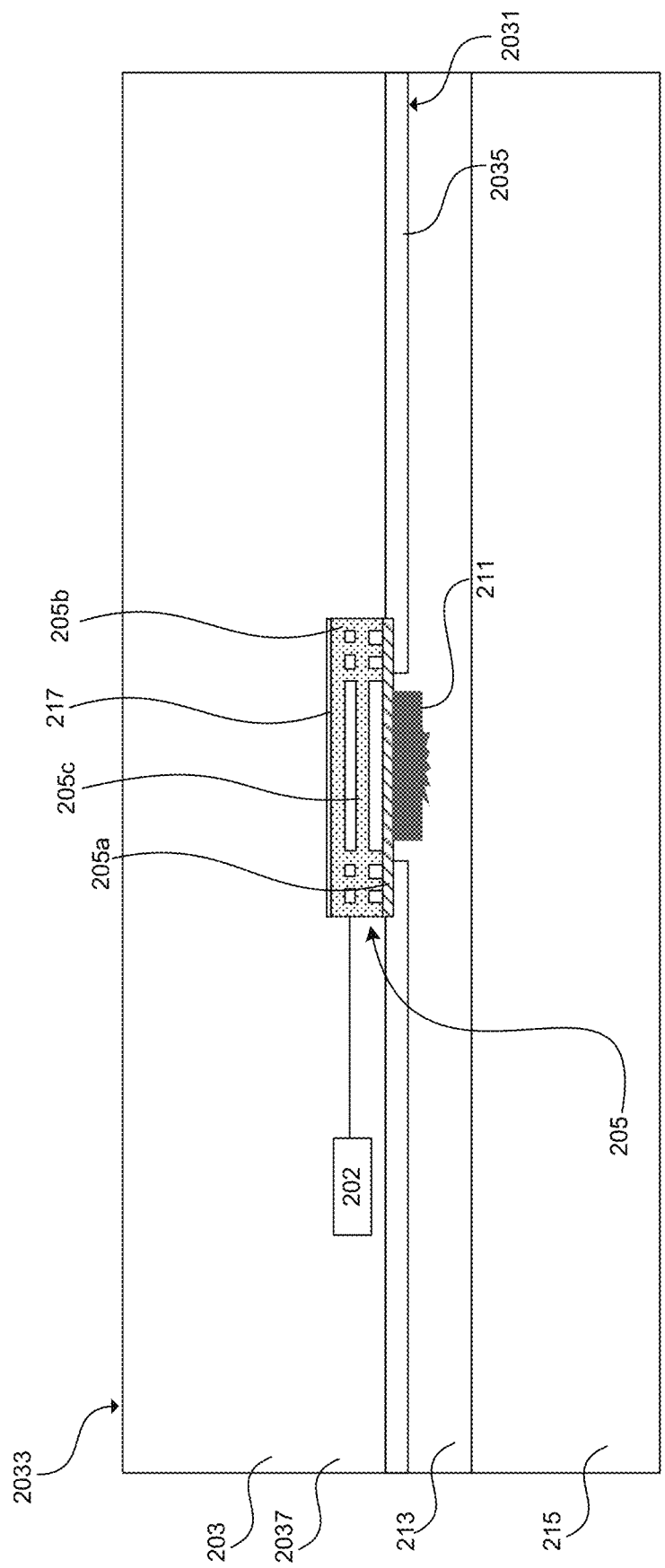

FIGS. 2A-2J are schematic cross-sectional views of a method for manufacturing a semiconductor device package 203 (e.g., the semiconductor device package 103 described in FIG. 1) in accordance with the present technology. Like reference numbers refer to like components throughout FIGS. 2A-2J. Referring to FIG. 2A, at this stage of the method the semiconductor device package 203 has a substrate 2037 with a first side 2031 (e.g., a front/active side) and a second side 2033 (e.g., a back/inactive side) opposite to the first side 2031. The semiconductor device package 203 can have a metallization structure 205 formed during a BEOL manufacturing process including first, second, and third metallization layers 205a, 205b, and 205c in the substrate 2037. In some embodiments, the first metallization layer 205a can include aluminum or another suitable metal or conductive materials. For example, the first metallization layer 205a can be an aluminum pad. The second metallization layer 205b can include copper or another suitable metal or conductive material, and the third metallization layer 205c can include copper or another suitable metal or conductive materials. The metallization structure 205 is electrically coupled to one or more semiconductor components 202 (e.g., integrated circuitry) in the semiconductor device package 203.

In some embodiments, the semiconductor device package 203 can also have a barrier layer 217 between a portion of the metallization structure 205 and the substrate 2037. The barrier layer 217, for example, can be adjacent to the second metallization layer 205b. The barrier layer 217 can be made of a metal, such as tantalum, to prevent diffusion into the substrate 2037. For example, the second metallization layer 205b can include copper and the barrier layer 217 can be made of tantalum to inhibit the copper from diffusing into the substrate 2037.

FIG. 2A shows the semiconductor device package 203 after a passivation layer 2035 has been applied to the first side 2031 of the semiconductor device package 203 to protect the semiconductor device package 203. In some embodiments, the passivation layer 2035 can include an oxide layer, an inert layer (e.g., a layer that is less likely to chemically react with air or corrode), other suitable protective layers, or a pre-formed protective film. The semiconductor device package 203 can also include a contacting area 207 on the first metallization layer 205a at the first side 2031.

FIG. 2B shows the semiconductor device package 203 after metal bumps 211 have been formed on the contacting area 207. The metal bumps 211 are electrically coupled to the metallization structure 205 and configured to provide the electrical and mechanical connection to a metallization structure of another semiconductor device package (see e.g., FIG. 1) stacked on the semiconductor device package 203. The metal bumps 211 can be made from indium or other suitable conductive materials.

In some embodiments, the metal bumps 211 can have a vertical dimension VD of approximately 10-20 µm, or more specifically approximately 15 µm. The metal bump 211 can be formed by an electroplating process in which a seed material is deposited on the contact area 207 of the first metallization layer 205a, and then a conductive material is plated onto the seed material to form the metal bumps 211 on the first metallization layer 205a. Alternatively, the metal bumps 211 can be formed by an inkjet process, cold annealing, or other suitable methods.

FIG. 2C shows the semiconductor device package 203 after it has been coupled to a carrier 215 via a bonding layer 213. The carrier 215 is configured to temporarily hold and support the semiconductor device package 203 in the manufacturing process described below with reference to FIGS. 2D-2J. The carrier 215 can be reusable or disposable, such as a glass carrier, a silicon carrier, or a plastic carrier. In some embodiments, the bonding layer 213 can be a release tape (e.g., gas-sensitive or temperature-sensitive), flowable adhesive, or other suitable materials. The bonding layer 213 can be dissolved using a fluid (gas or liquid) or ablated using a laser to release the semiconductor device package 203 from the carrier 215.

Figure 2D:
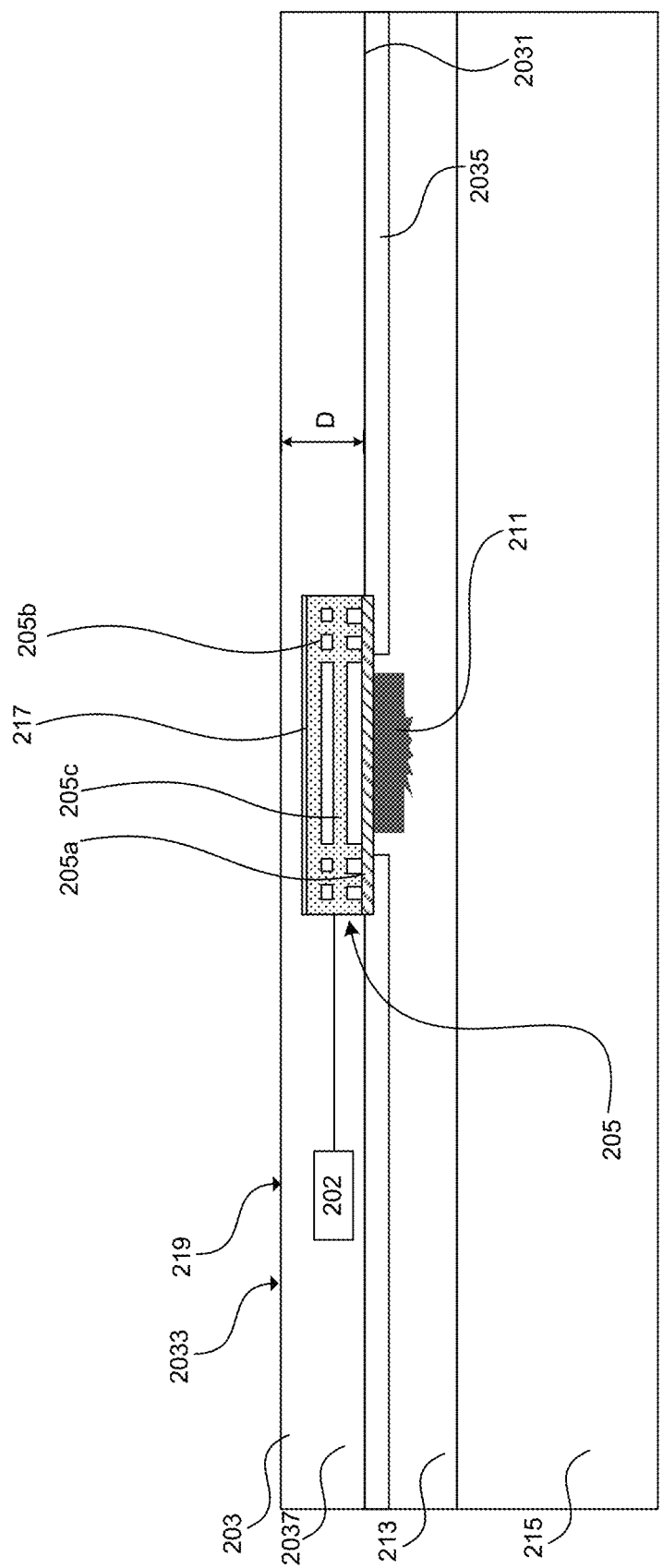

FIG. 2D illustrates the semiconductor device package 203 after the substrate 2037 has been thinned. Referring to FIG. 2D, the substrate 2037 can be thinned to a thickness D between a thinned surface 219 and the first side 2031. In some embodiments, the thickness D of the substrate 2037 can range from 5-30 µm, and for example not more than 30 µm, 25 µm, 20 µm, 15 µm, 10 µm or 5 µm.

By thinning the substrate 2037 to this extent, the metallization structure 205 of the semiconductor device package 203 can be accessed and electrically coupled to other metallization structures or semiconductor components of stacked semiconductor device packages without using TSVs. Generally speaking, to form a TSV in a semiconductor structure, the smallest thickness of the semiconductor substrate can be around 50 µm. This is 200%-1000% thicker than the semiconductor device package 203 and semiconductor device packages 103 (FIG. 1) of the present technology. Therefore, the improved method provided by the present technology is advantageous at least because it provides semiconductor device packages with smaller thicknesses (or vertical dimensions) and that can be stacked without forming TSVs. It is particularly beneficial for manufacturing compact semiconductor devices or packages.

Figure 2E:
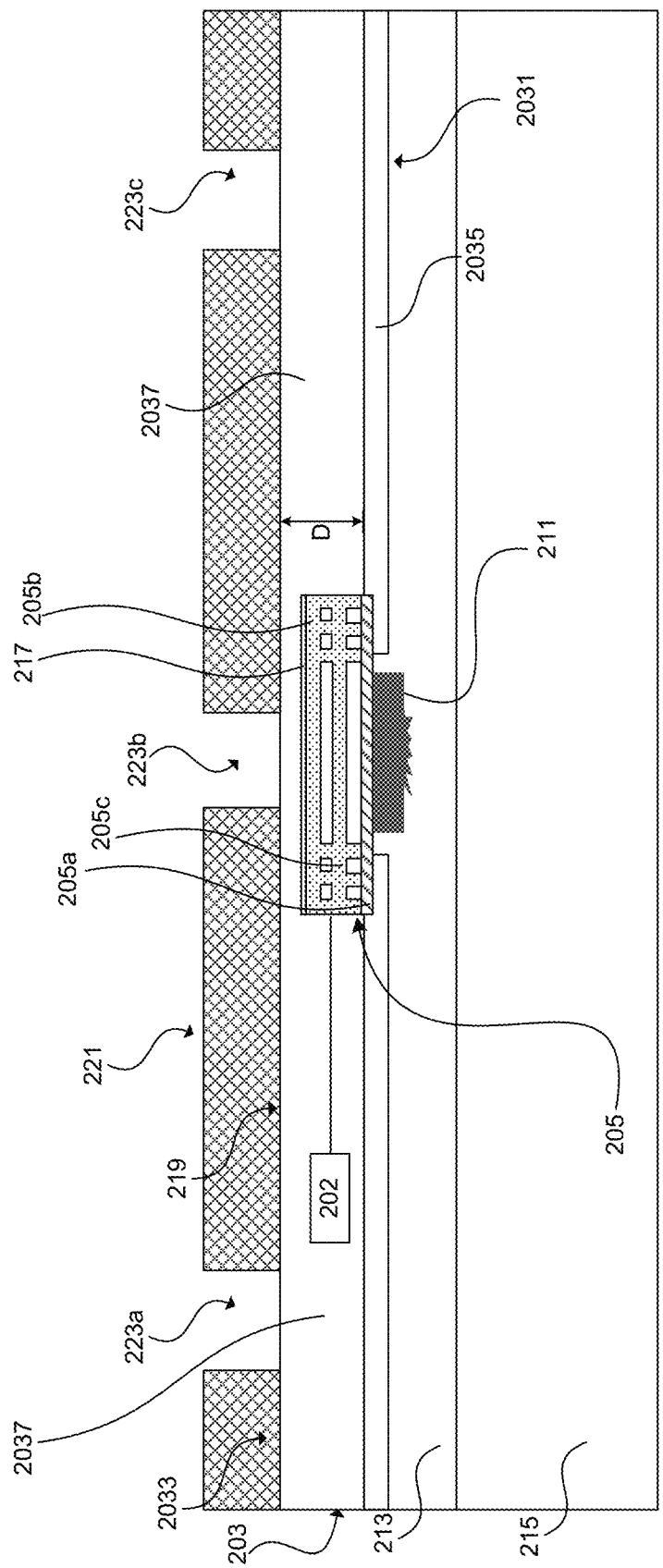

FIG. 2E illustrates a stage of the process after a first patterned photo-resist layer 221 has been formed on the second side 2033 (back/inactive side) of the semiconductor device package 203. As shown, the first patterned photo-resist layer 221 has multiple openings 223a-c (only three are shown in FIG. 2E—first, second, and third openings 223a, 223b, and 223c). As shown, the first and third openings 223a, 223c are on opposite sides of the semiconductor device package 203. The first and third openings 223a, 223c can be used to separate or "singulate" the semiconductor device package 203 in a later stage of the process. The second opening 223b is aligned with at least a portion of the metallization structure 205 in the semiconductor device package 203.

Figure 2F:
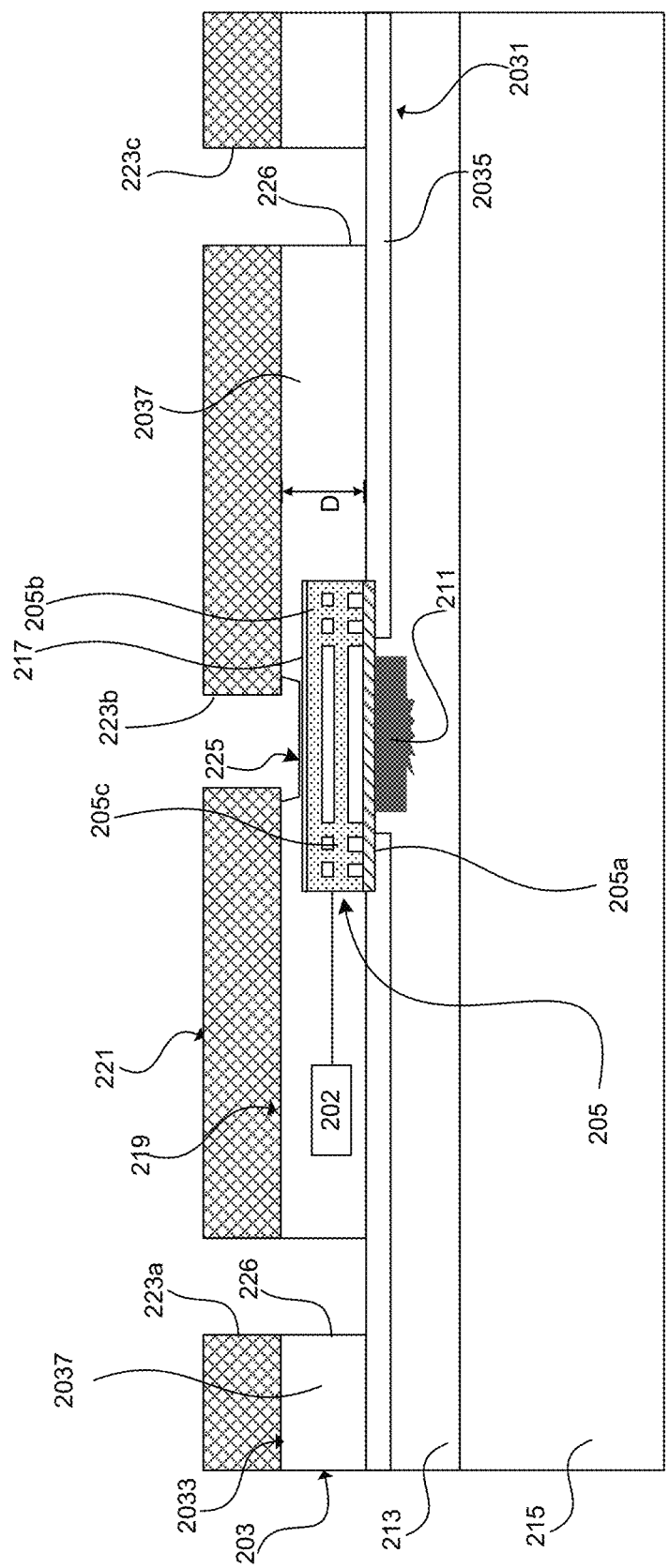

FIG. 2F shows a stage of the process after openings 226 have been formed through the substrate 2037 via the first and third openings 223a, 223c to expose the passivation layer 2035. The openings 226 can be formed by etching the substrate 2037 of the semiconductor device package 203. In the same etching process, a recess 225 (e.g., a divot or trench) can be formed in the substrate 2037 through the second opening 223b (e.g., the second opening 223b extends in the direction toward the first side 2031 of the semiconductor device package 203). The recess 225 can be another opening that exposes the barrier layer 217. As shown, the recess 225 has sloped sidewalls (at both left and right sides of the recess 225, as shown in FIG. 2F), which can facilitate coupling a metal bump of another semiconductor device package to the metallization structures 205. Alternatively, the opening 226 and recess 225 can be formed by laser ablating the substrate 2037 without forming the patterned photo-resist layer 221.

Figure 2G:
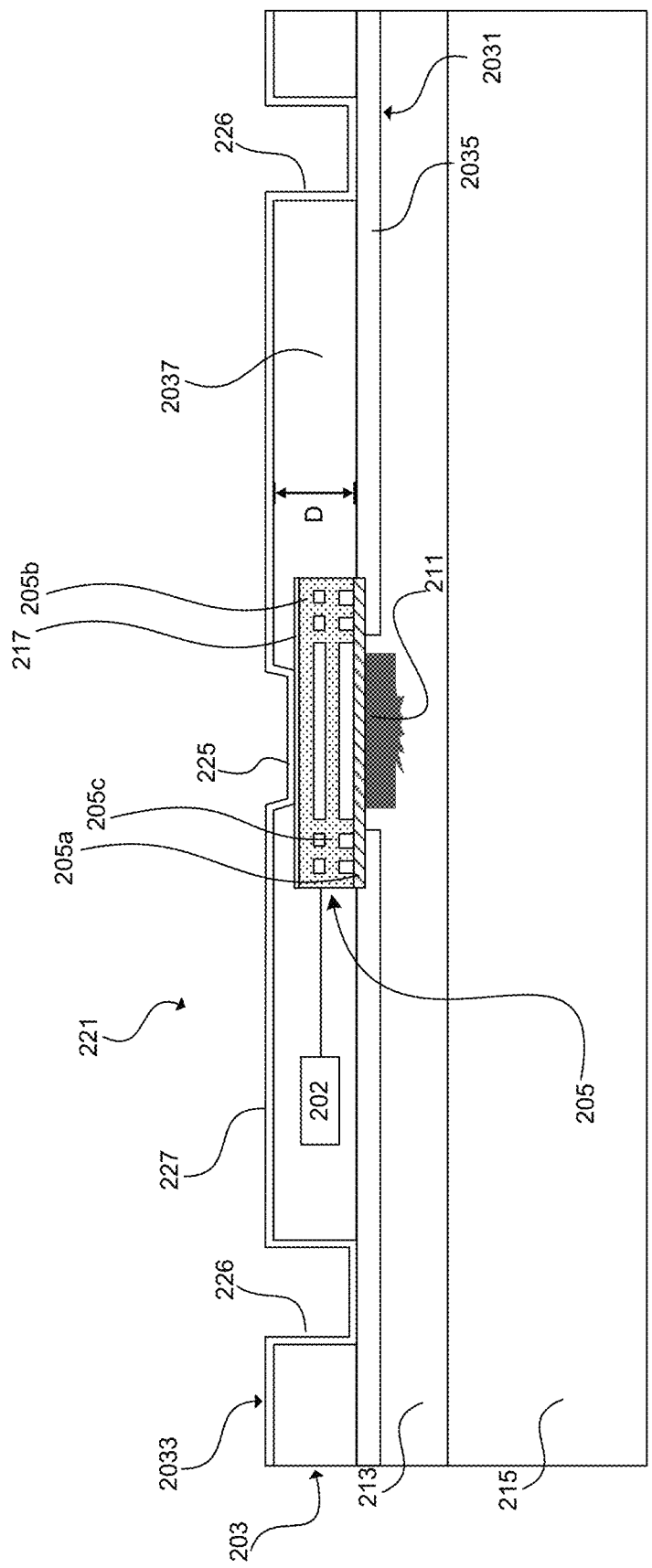

FIG. 2G shows a stage of the process after the first photo-resist layer 221 has been removed and a dielectric layer 227 has been formed on the second side 2033 of the semiconductor device package 203. The dielectric layer 227 can be formed by a chemical vapor deposition (CVD) process, such as a CVD tetraethyl-orthosilicate (TEOS) layer. Alternatively, the dielectric layer 227 can be formed by a spin-on process.

Figure 2H:
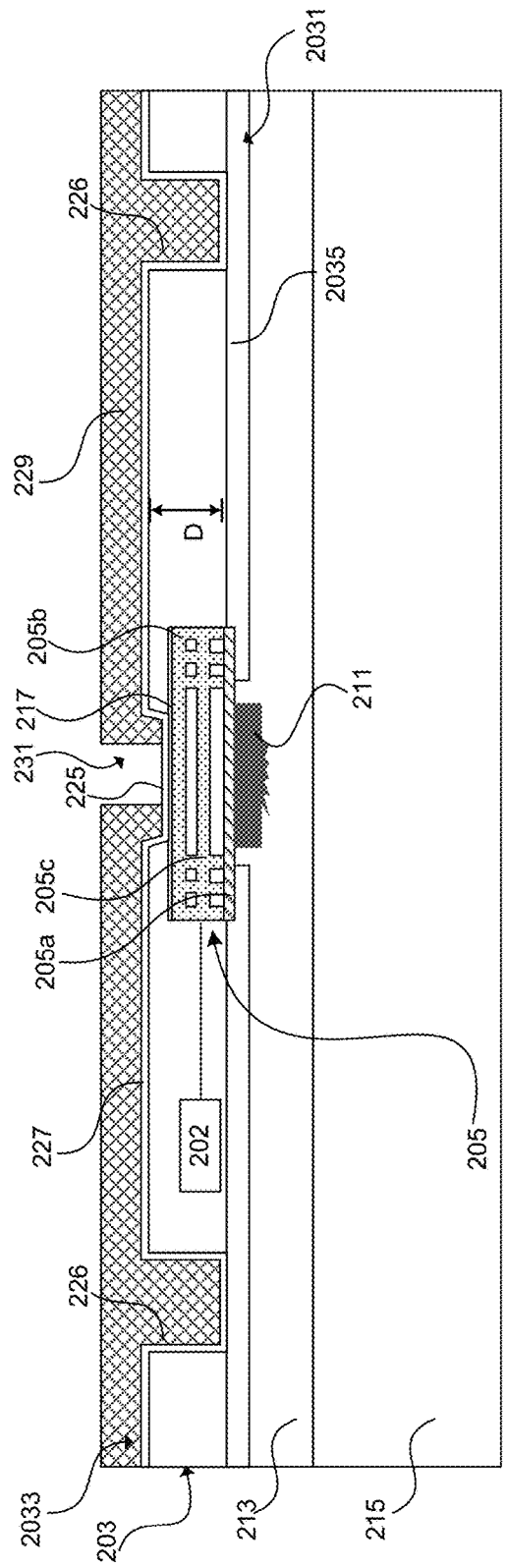
Figure 2I:
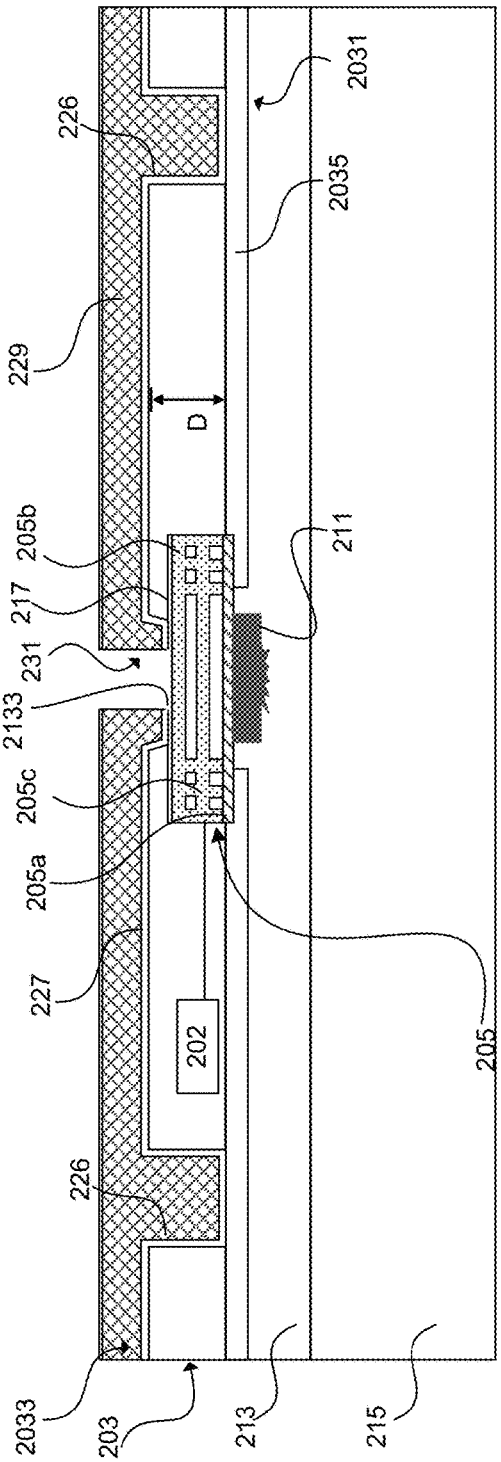

FIGS. 2H and 2I show stages of the process after a second patterned photo-resist layer 229 (or a second photo-pattern mask) has been formed on the second side 203*3* (back/inactive side) of the semiconductor device package 203. The second patterned photo-resist layer 229 fills the first and third openings 223*a*, 223*c* and has an opening 231 aligned with the metal structure 205. FIG. 2I shows a stage of the process after the dielectric layer 227 and the barrier layer 217 within the opening 231 have been removed to expose the third metallization layer 205*c* through an opening 2133. In some embodiments, the barrier layer 217 is not removed. Factors to consider whether to remove the barrier layer 217 include, for example, the types of materials used in the barrier layer 217, the third metallization layer 205*c*, and the metal bump 211.

Figure 2J:
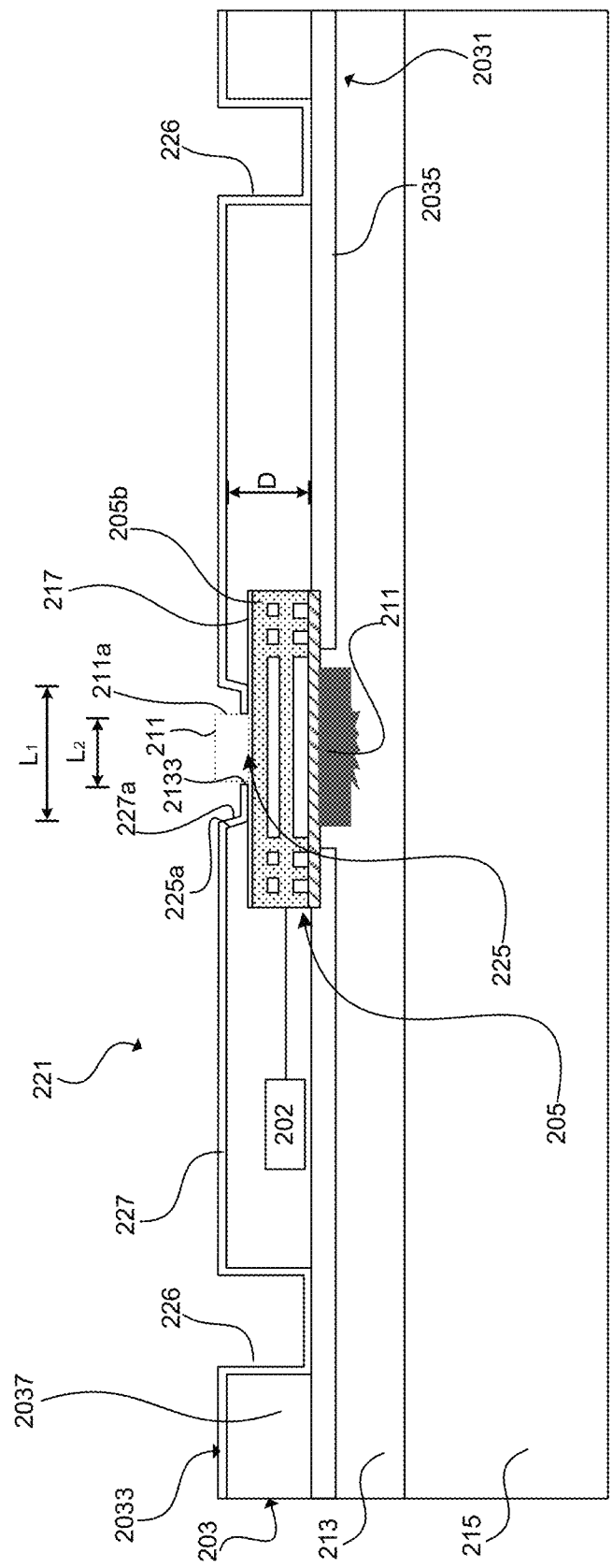

FIG. 2J shows a stage of the process after the second photo-resist layer 229 has been removed. The recess 225 has a lateral dimension $L_1$ that is larger than the lateral dimension $L_2$ of a metal bump 211 (shown in dotted lines) to be attached to the metal structure 205. As such, a sidewall 225*a* of the recess 225 and a sidewall portion 227*a* of the dielectric layer 227 are spaced apart from a sidewall 211*a* of the metal bump 211. At this stage of the process, the carrier 215 can be removed and one or more semiconductor device packages 203 can be stacked on each other.

Figure 3A:
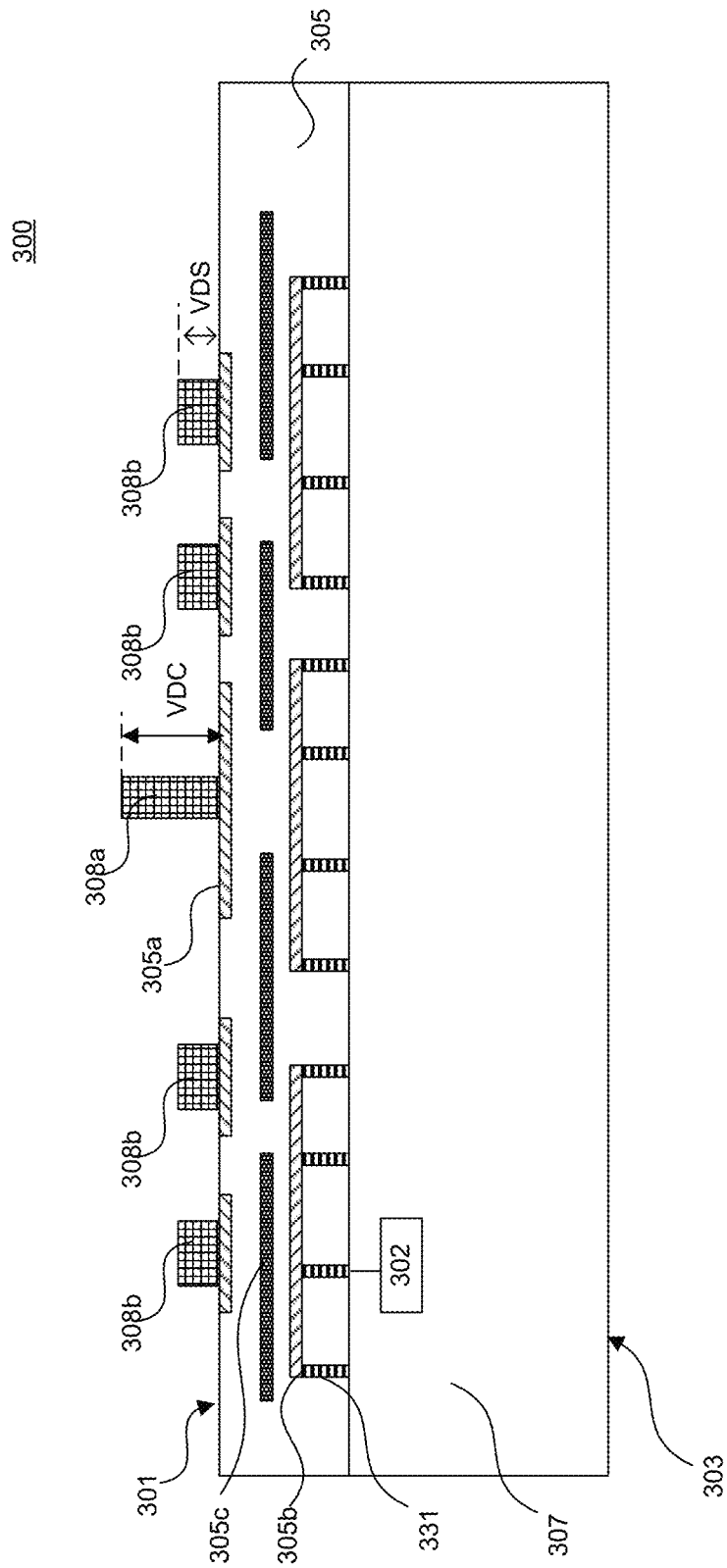
FIGS. 3A-3I are schematic cross-sectional views illustrating a method of forming a semiconductor device package in accordance with the present technology.

FIGS. 3A-3I are schematic cross-sectional views illustrating a method of forming a semiconductor device package in accordance with the present technology. Like reference numbers refer to like components throughout FIGS. 3A-3I. Referring to FIG. 3A, a semiconductor device package 300 has a first side 301 (e.g., a front/active side) and a second side 303 (e.g., a back/inactive side) opposite to the first side 301. The semiconductor device package 300 can have a substrate 307 and a metallization structure 305 formed during a BEOL manufacturing process, including first, second, and third metallization layers 305*a*, 305*b*, and 305*c*. The semiconductor device package 300 can have conductive vias 331 coupled to features in the metallization structure 305. In the illustrated embodiments shown in FIGS. 3A-3I, the conductive vias 331 are coupled to the second metallization layer 305*b*. In other embodiments, the conductive vias 331 can be coupled to other metallization layers (e.g., the first metallization layer 305*a* or the third metallization layer 305*c*). The metallization layers 305*a*-*c* can include conductive traces, pads, conductive planes and/or electrical components (e.g., capacitors, resistors, etc.) that form one or more circuits (e.g., a live circuit, an open circuit, etc.).

The substrate 307 can be a semiconductor substrate that formed from silicon or other suitable materials, and integrated circuitry can be formed on/in the substrate to form memory devices, logic devices or processors. In the illustrated embodiment, the metallization structure 305 is electrically coupled to a semiconductor component 302 (e.g., integrated circuitry) in the substrate 307. The first metallization layer 305*a* can include aluminum, or other suitable metal or conductive materials, and be formed into one or more pads. In some embodiments, the second and third metallization layers 305*b* and 305*c* can include copper or other suitable metal or conductive materials.

In some embodiments, the semiconductor device package 300 can have a barrier layer (not shown in FIG. 3A, similar to the barrier layer 217 shown in FIG. 2A) between a portion of the metallization structure 305 and the substrate 307. The barrier layer can alternatively be adjacent to the second metallization layer 305*b*. In some embodiments, the barrier layer can be made of a metal, such as tantalum, and the second metallization layer 305*b* can include copper, such that the tantalum barrier layer inhibits diffusion of the copper into the substrate 307.

The semiconductor device package 300 can also include a passivation layer (not shown) similar to the passivation layer 203*5* shown in FIG. 2A at the first side 301 of the semiconductor device package 300. The passivation layer can protect the semiconductor device package 300. In some embodiments, the passivation layer can include an oxide layer, an inert layer (e.g., a layer that is less likely to chemically react with air or corrode), or other suitable protective layers or protective films.

As shown in FIG. 3A, the semiconductor device package 300 includes a center metal bump 308*a* and side metal bumps 308*b* (four are shown in FIG. 3A) at both sides of the center metal bump 308*a*. As shown, the center metal bump 308*a* has a vertical dimension greater than those of the side metal bumps 308*b*. For example, the center metal bump 308*a* can have a vertical dimension VDC of approximately 10-20 μm and the side metal bumps 308*b* can have a vertical dimension VDS of approximately 5-10 μm. The vertical dimension VDC can be approximately 15 μm, while the vertical dimension VDS can be approximately 7.5 μm. The center metal bump 308*a* is taller than the side metal bumps 308*b* so that the center metal bump 308*a* can be positioned in a cavity of another semiconductor device package when the semiconductor device package 300 is stacked on that semiconductor device package, as described below with reference to FIGS. 3G and 3H.

Figure 3B:
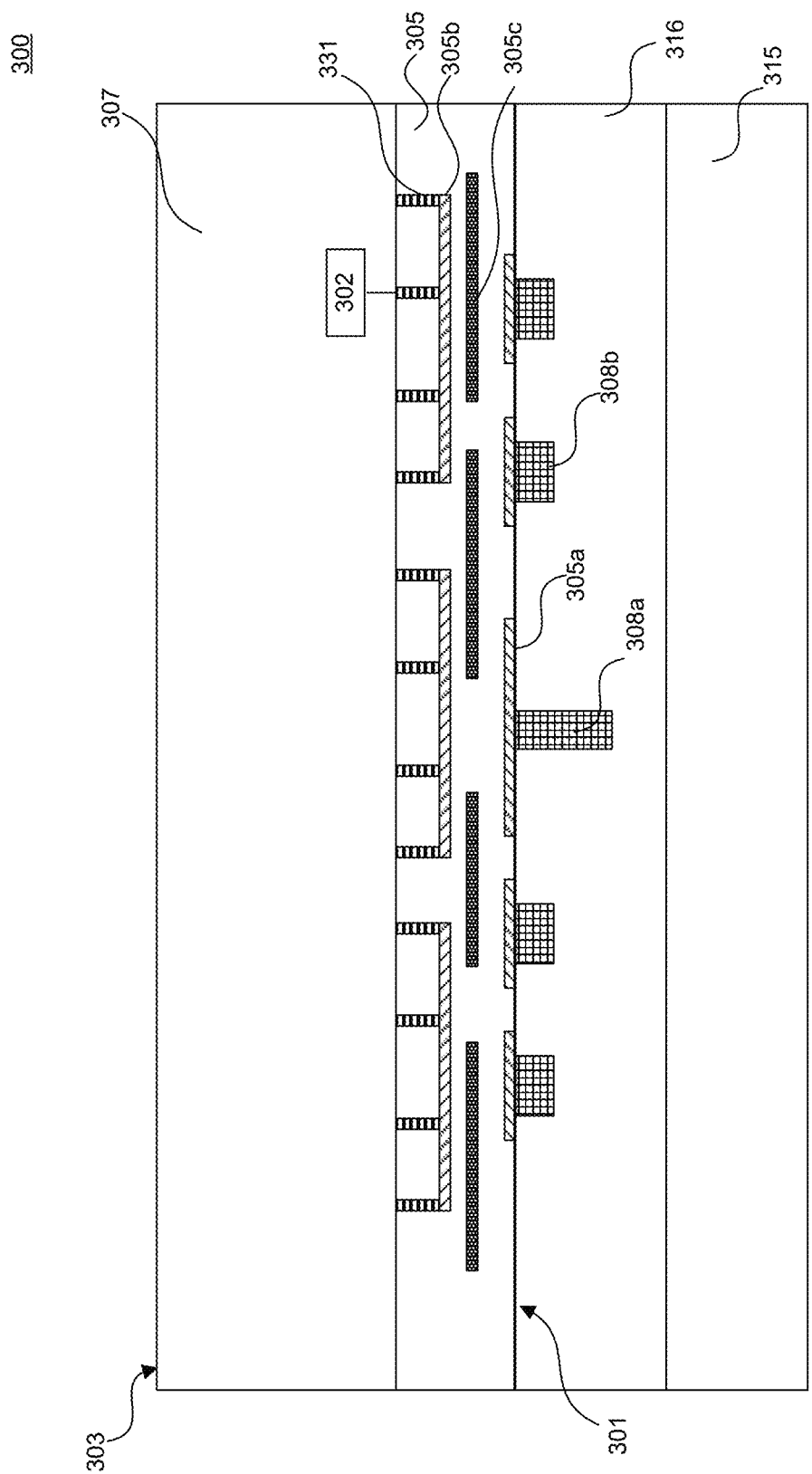
Figure 3C:
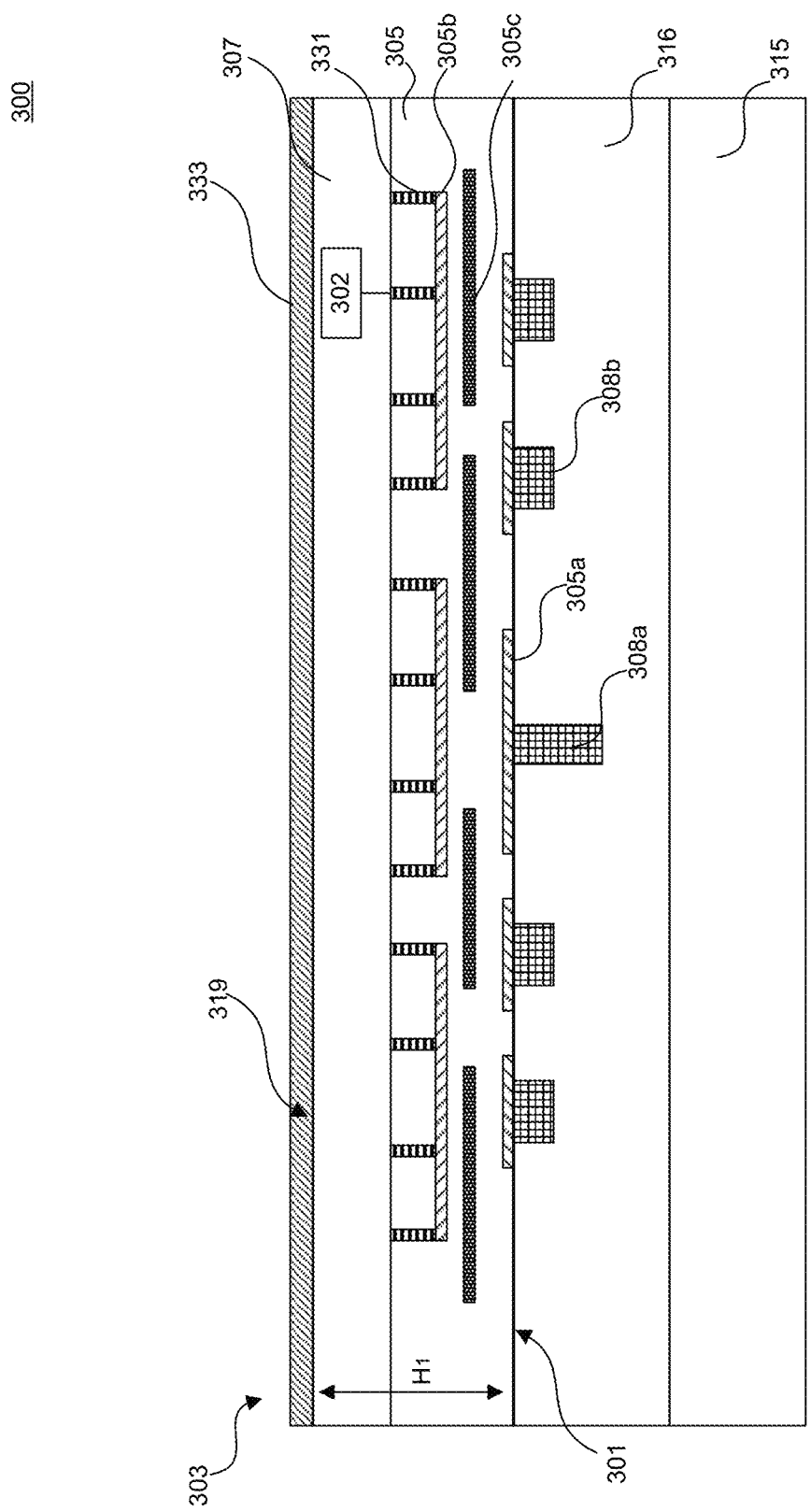
Figure 3D:
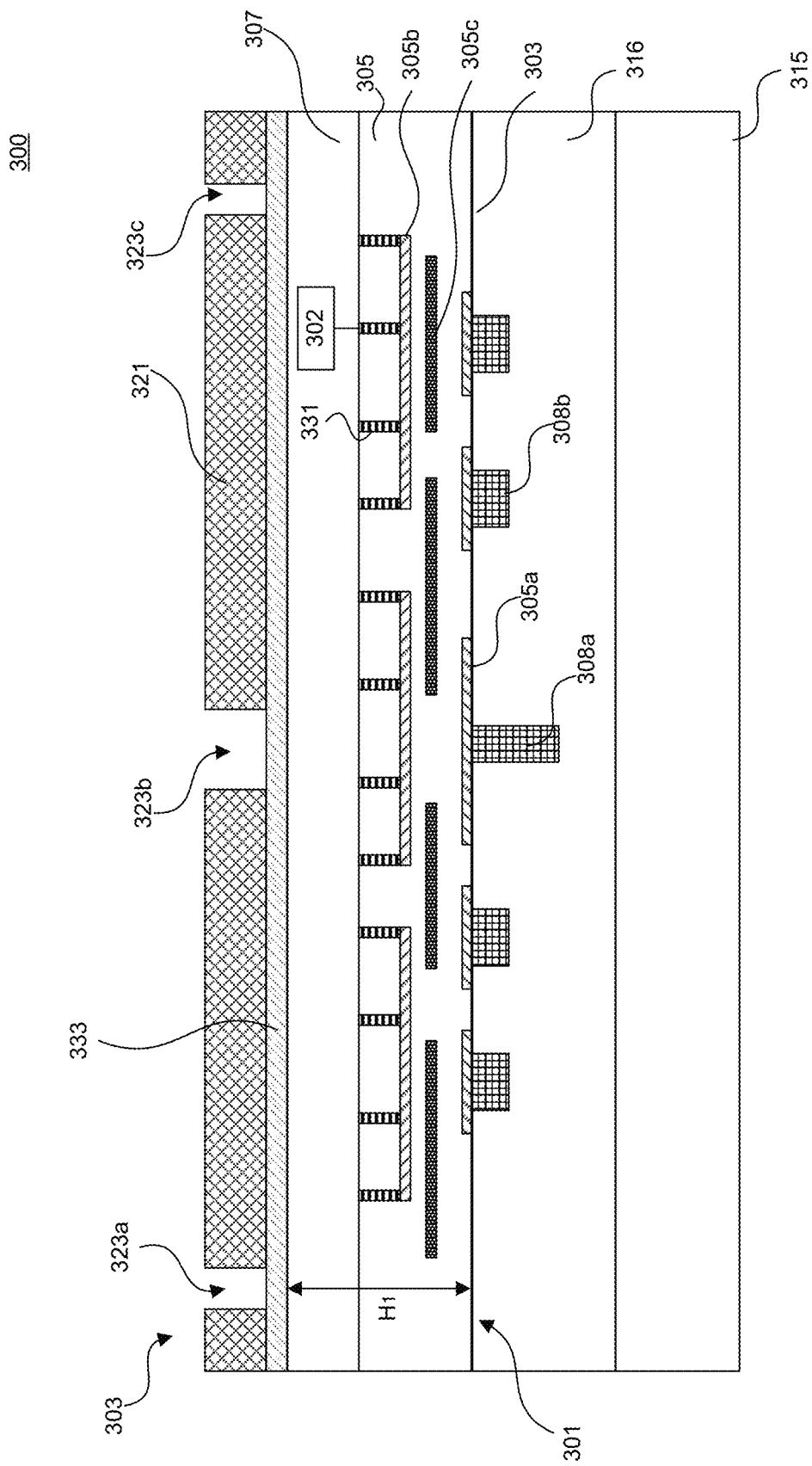
Figure 3E:
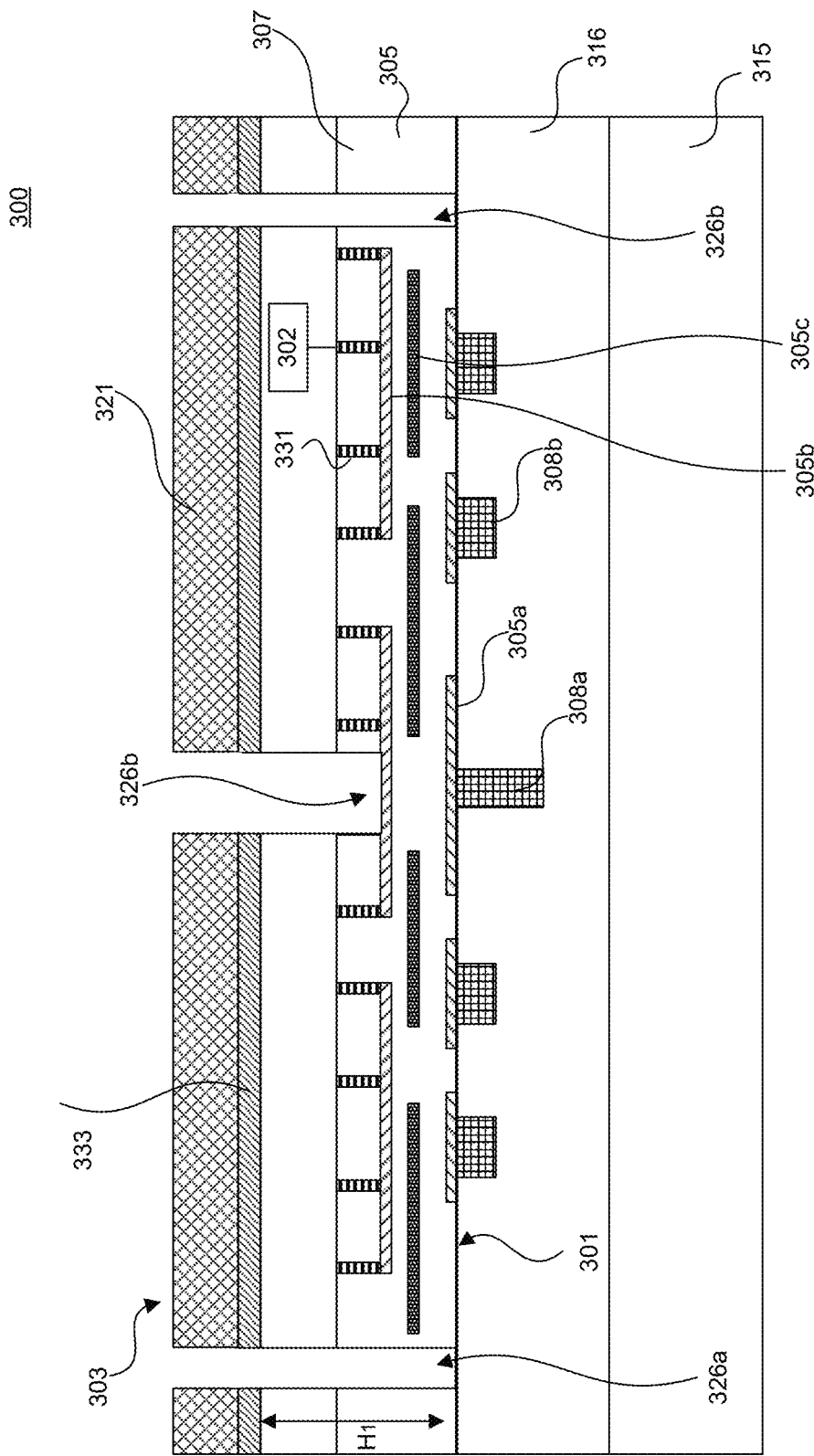
Figure 3F:
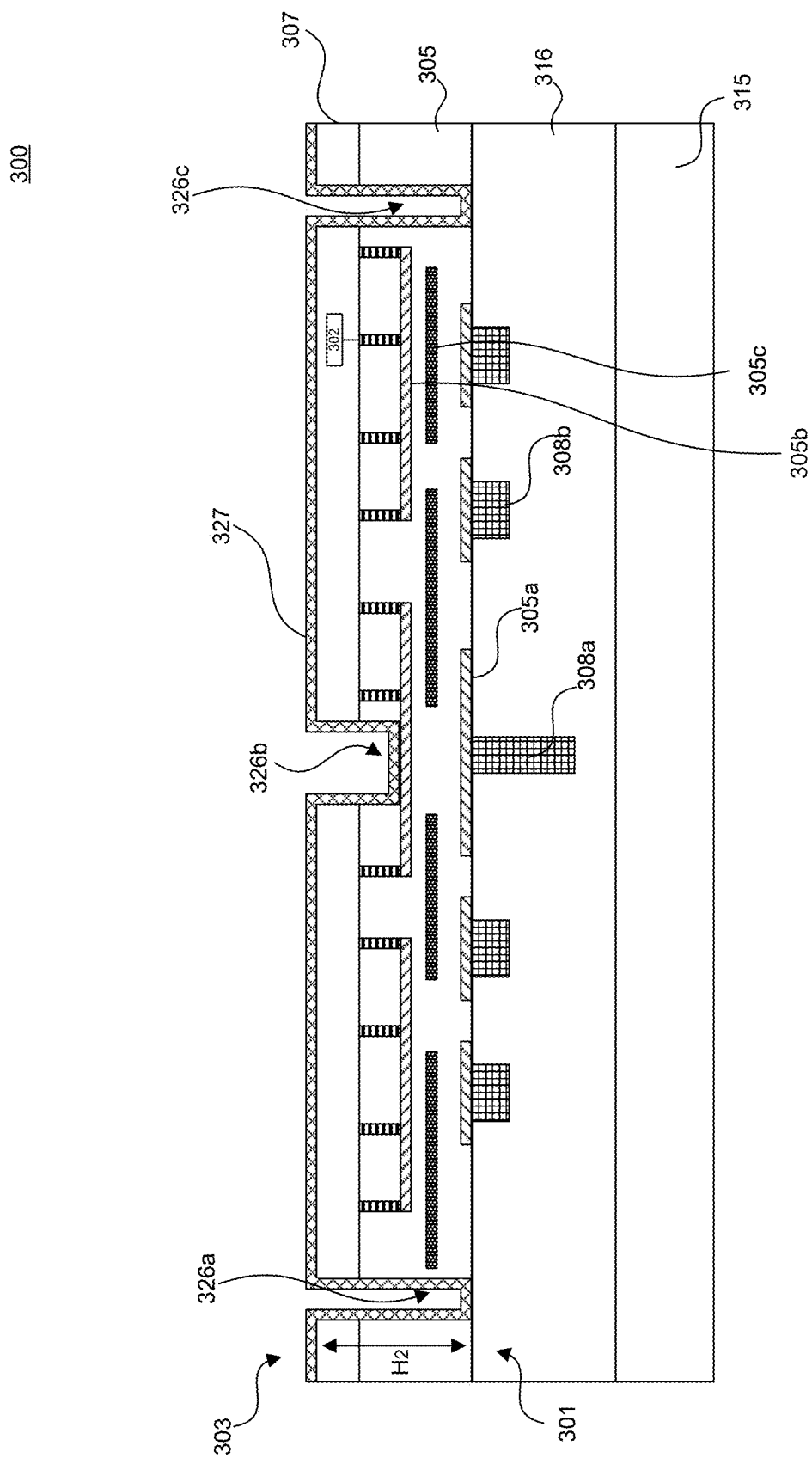
Figure 3G:
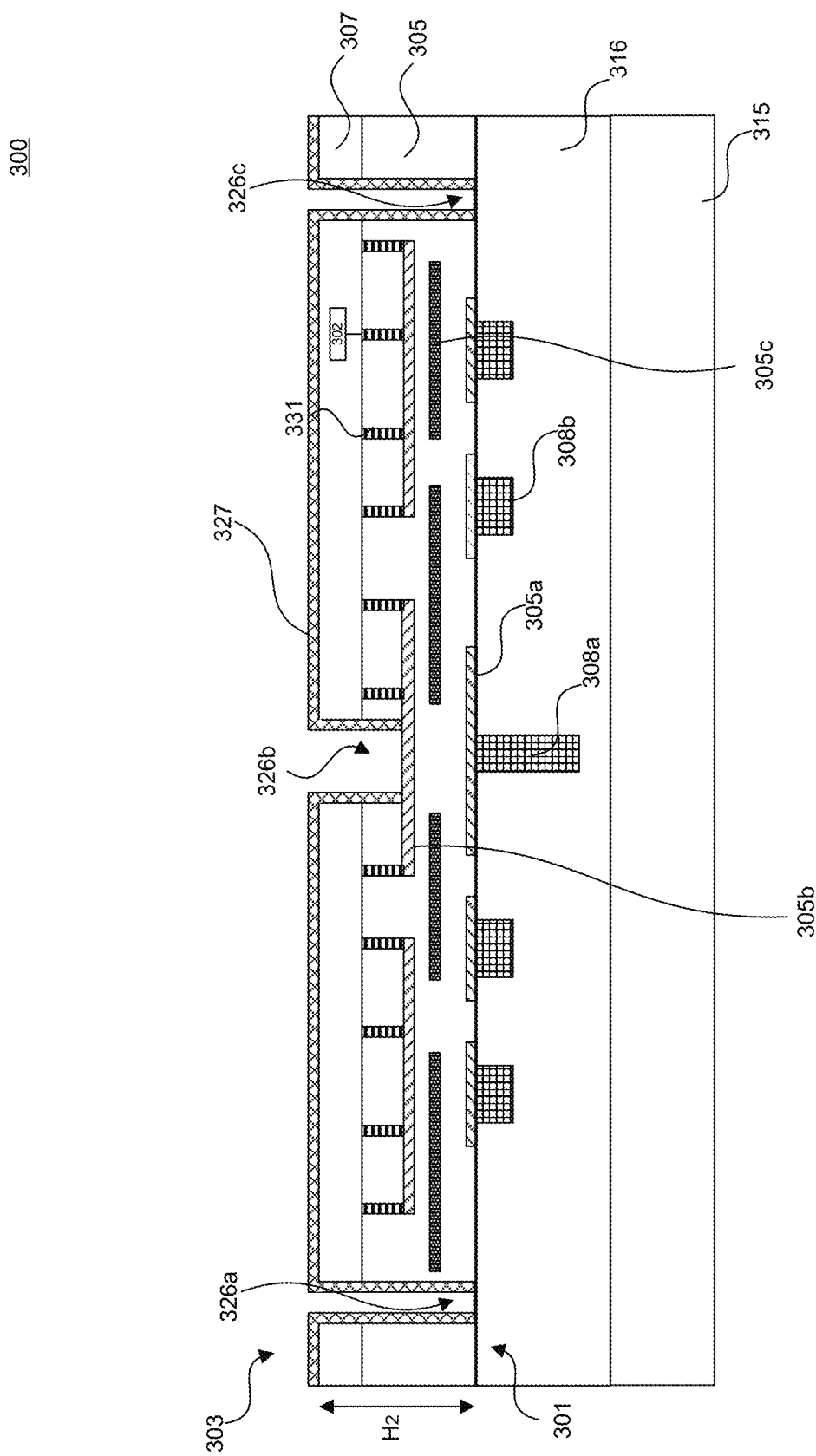
Figure 3H:
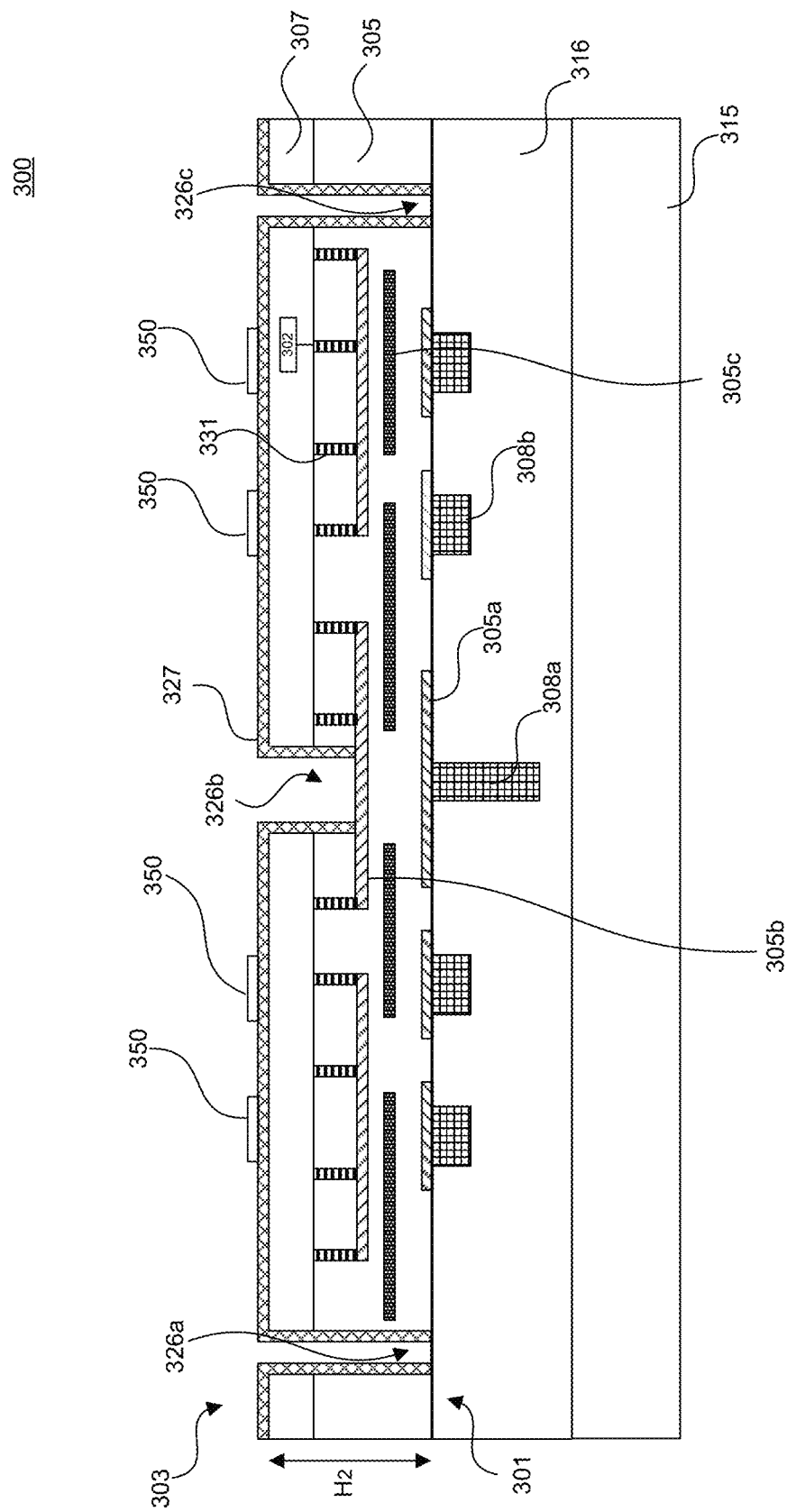

The center and side metal bumps 308*a*, 308*b* are electrically coupled to the metallization structure 305 and configured to be in electrical contact with a metallization layer of another semiconductor device package (see e.g., FIG. 3H). In some embodiments, the metal bumps 308*a*, 308*b* can include an indium bump. In other embodiments, the metal bumps 308*a*, 308*b* can include other suitable conductive materials.

In some embodiments, the center and side metal bumps 308*a*, 308*b* can be pillars formed by an electroplating process. For example, the metal bumps 308*a*, 308*b* can be formed by having a seed material adjacent to the first metallization layer 305*a*, and the conductive material can be plated onto the seed material. In other embodiments, the metal bumps 308*a*, 308*b* can be formed by an inkjet process or other suitable methods. In some embodiments, the metal bumps 308*a*, 308*b* can be cold annealed (e.g., at 200° C.).

FIG. 3B shows the semiconductor device package 300 after it has been inverted and coupled to a carrier 315 via an adhesive 316. The carrier 315 is configured to hold and support the semiconductor device package 300 in the manufacturing process described below with reference to FIGS. 3C-3H. The carrier 315 can be a reusable carrier or a non-reusable carrier made from glass, silicon or plastic. The metal bumps 308*a* and 308*b* are embedded in the adhesive 316, which can be a partially cured layer of resin or other suitable material.

FIG. 3C illustrates the semiconductor device package 300 after the substrate 307 has been thinned. Referring to FIG. 3C, the semiconductor device package 300 can be thinned such that a depth $H_1$ between a thinned surface 319 and the first side 203*1* of the semiconductor device package 203 is approximately 10 μm. The depth $H_1$ can range from 5-30 μm, and more specifically the depth $H_1$ is not more than 30 μm, 25 μm, 20 μm, 15 μm, 10 μm or 5 μm.

By thinning the substrate 307 to this extent, the metallization structure 305 can be accessed and electrically coupled to other metallization layers or semiconductor components of another semiconductor device package without using a TSV. Generally speaking, to form a TSV in a semiconductor structure, the smallest depth of the semiconductor structure that the semiconductor structure can be thinned is around 50 µm. Therefore, the improved method provided by the present technology is advantageous at least in part because it can manufacture and stack semiconductor device packages with smaller depths (or vertical dimensions) and without the processing steps to form TSVs. It is particularly beneficial for manufacturing compact semiconductor devices or packages.

FIG. 3C also shows the semiconductor package 300 after a coating layer 333 has been formed on the thinned surface 319. The coating layer can be an oxide layer that protects the thinned substrate 307 in subsequent processing, such as photolithographic and other processes discussed below with reference to FIGS. 3D and 3E.

FIG. 3D illustrates the semiconductor package 300 after a patterned photo-resist layer 321 (or a photo-pattern mask) has been formed on the second side 303 (back/inactive side) of the semiconductor device package 300. As shown, the photo-resist layer 321 has multiple openings 323a-c (identified as first, second, and third openings 323a, 323b, and 323c). The first and third openings 323a, 323c are formed on opposite sides of the semiconductor device package 300 and can be used to separate or "singulate" the semiconductor device package 300 later in the process. The second opening 323b is at the midline, and more particularly it can be aligned with the center metal bump 308a.

FIG. 3E shows the semiconductor device package 300 after channels 326a, 326c have been formed through the semiconductor device package 300 via the first and third openings 323a, 323c. The channels 326a, 326c can be formed by etching the substrate 307 through the openings 323a, 323c.

In the same process as forming the channels 326a, 326c, a cavity 326b can be formed through the substrate 307 and a portion of the metallization structure 305 via the second opening 323b. The cavity 326b can extend to the second metallization layer 305b and thereby expose a portion of the second metallization layer 305b.

FIG. 3F shows the semiconductor device package 300 after the photo-resist layer 321 and the coating layer 333 have been removed and a dielectric layer 327 has been formed on the second side 303 of the semiconductor device package 300. In some embodiments, the dielectric layer 327 can be formed by a chemical vapor deposition (CVD) process, such as a CVD tetraethyl-orthosilicate (TEOS) layer. Alternatively, the dielectric layer 327 can be formed by a spin-on process or applying a pre-formed dielectric film. In some embodiments, a portion of the substrate 307 can also be removed to further thin the substrate. In such embodiments, depth $H_2$ as indicated in FIG. 3F can be smaller than depth $H_1$.

FIG. 3G shows the semiconductor device package 300 after portions of the dielectric layer 327 at the bottom of the channels 326a and 326c and the bottom of the cavity 326b have been removed. In some embodiments, the portion of the dielectric layer 327 can be removed by an etching process. As shown in FIG. 3G, after removing the portion of the dielectric layer 327 within the cavity 326b, a portion of the second metallization layer 305b is exposed in the cavity 326b.

FIG. 3H shows the semiconductor device package 300 after connecting sites 350 (four are shown in FIG. 3H) have been formed on the second side 303 of the semiconductor device package 300. The connecting sites 350 are aligned with the side metal bumps 308b and configured to be coupled to and in contact with side metal bumps (similar to the side metal bumps 308b discussed above) of another semiconductor device package in a stacked arrangement. In some embodiments, the multiple connecting sites 350 can be formed by a masking/etching process. The multiple connecting sites 350 can be made of a metal such as aluminum, titanium, copper, etc.

Figure 3I:
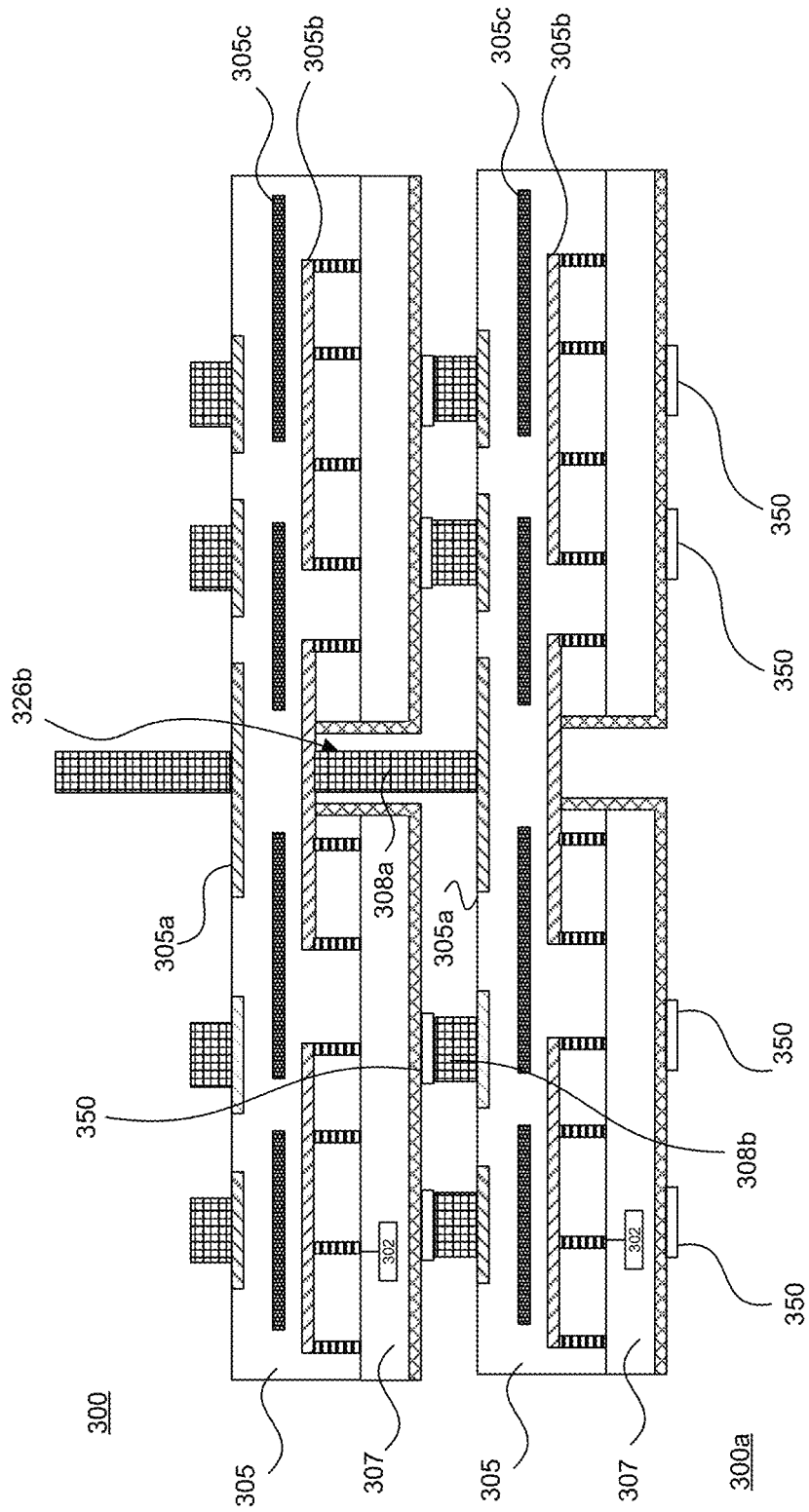

FIG. 3I shows the semiconductor device package 300 after the carrier 315 has been removed and another semiconductor device package 300a of the same configuration is stacked on the semiconductor device package 300. As shown, the center metal bump 308a of the semiconductor package 300a is aligned and positioned in the cavity 326b of the semiconductor device package 300 and electrically coupled to the second metallization layer 305b of the semiconductor device package 300. The side metal bumps 308b of the semiconductor device package 300a are aligned with and electrically coupled to corresponding connecting sites 350 of the semiconductor device package 300, respectively. In this way, several semiconductor device packages 300 can be stacked on each other with zero or near zero BLT and without forming TSVs through the substrate 307.

Figure 4A:
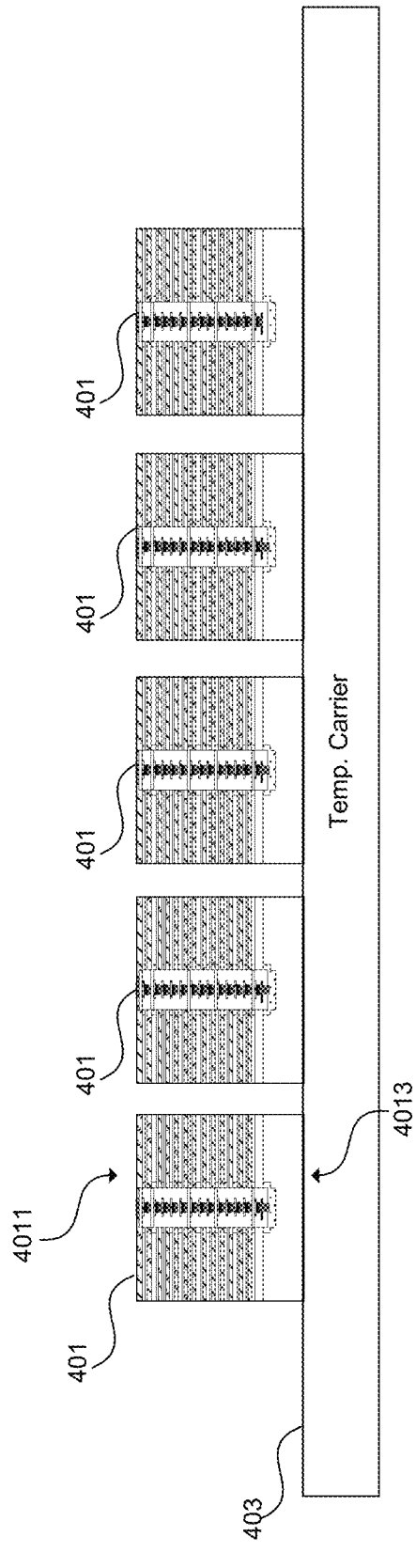
FIGS. 4A-4D are schematic cross-sectional views illustrating a method of processing multiple semiconductor device package assemblies in accordance with the present technology.

FIGS. 4A-4D illustrate methods of processing semiconductor device package assemblies 401 similar or identical to the semiconductor device package assembly 100 described with respect to FIG. 1, but the semiconductor device packages can also be used in the stacks of die. Each of the semiconductor device package assemblies 401 has a face side 4011 and a back side 4013. In FIG. 4A, the semiconductor device package assemblies 401 are carried by a temporary carrier 403. Each of the multiple semiconductor device package assemblies 401 includes a base substrate (e.g., the base component 101 in FIG. 1) at the back side 4013 and multiple semiconductor device packages (e.g., the semiconductor device packages 103 or 203) at the face side 4011. In the illustrated embodiments, the back sides 4013 of the semiconductor device package assemblies 401 are coupled to the temporary carrier 403 such that the device package assemblies 401 are spaced apart from each other.

Figure 4B:
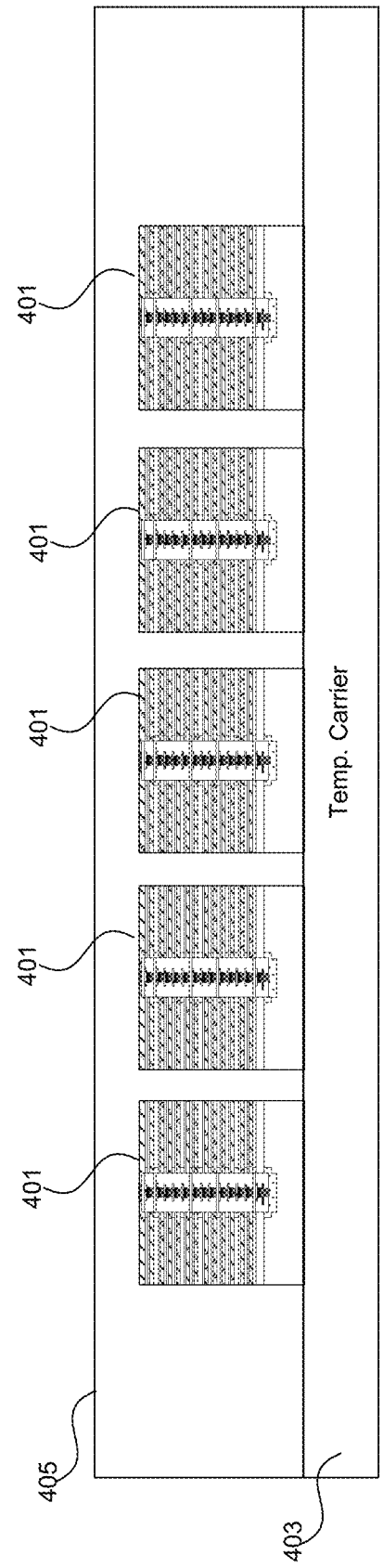

FIG. 4B shows the assembly after the semiconductor device package assemblies 401 have been covered by an encapsulant material 405. In some embodiments, the encapsulant material 405 can include resin, plastic, silicon, oxide, polymer, or other suitable dielectric materials.

Figure 4C:
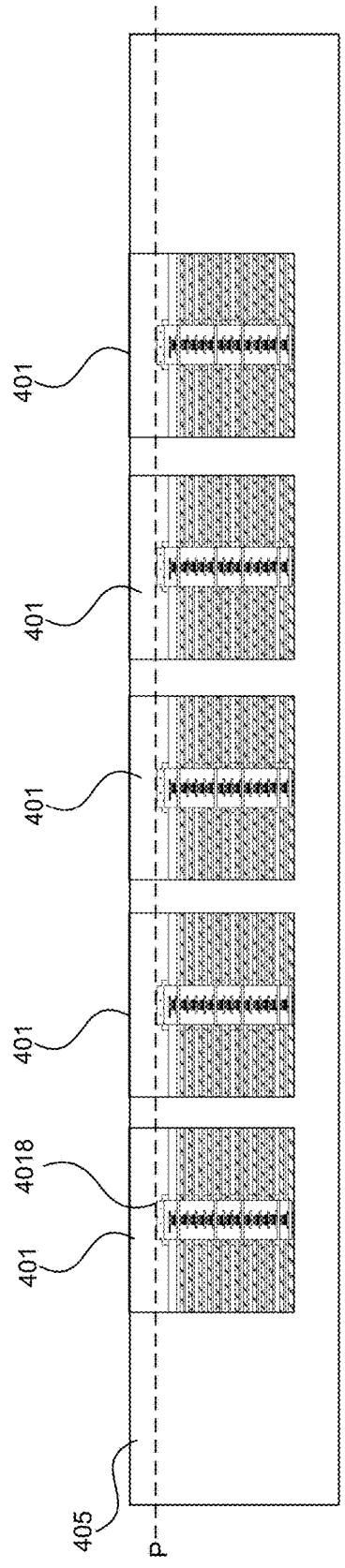

FIG. 4C shows the assembly after the temporary carrier 403 has been detached from the semiconductor device package assemblies 401. In FIG. 4C, the semiconductor device package assemblies 401 are inverted compared to FIG. 4B. An upper portion (e.g., the portion above plane P as indicated) of the assembly shown in FIG. 4C can be removed such that metallization structures 4018 of the semiconductor device package assemblies 401 can be exposed.

Figure 4D:
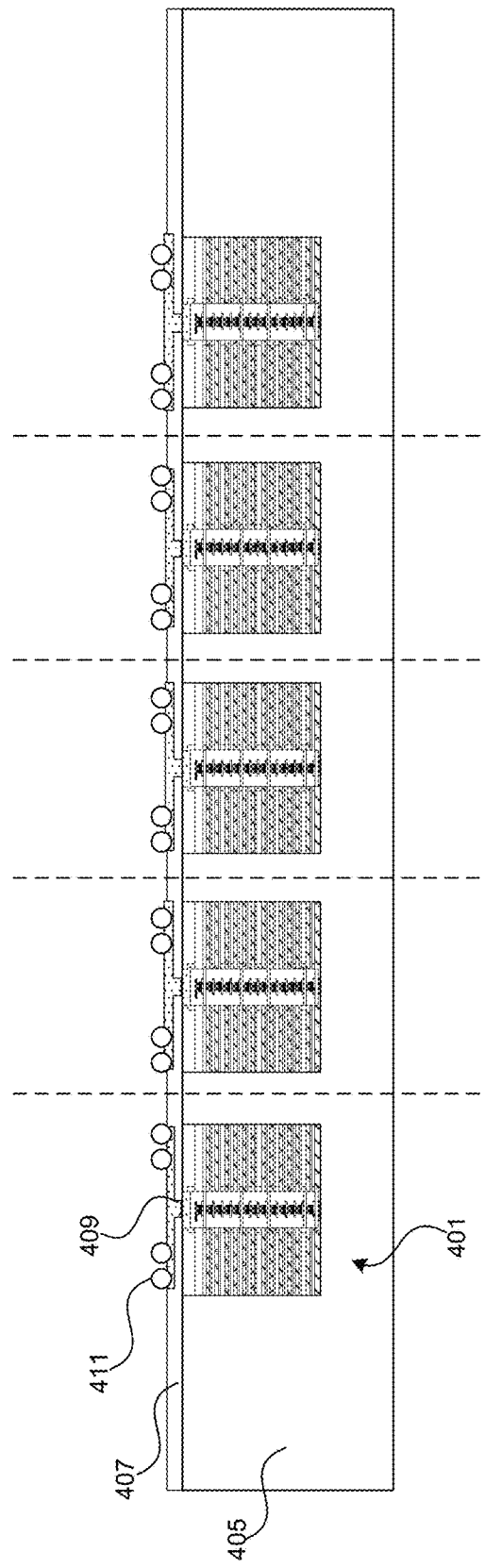

FIG. 4D shows the assembly after a polymer layer 407 has been formed on the semiconductor device package assemblies 401. The method can include forming a redistribution structure 409 using the polymer layer 407. The redistribution structure 409 is electrically coupled to the metallization layers 4018 in individual semiconductor device package assembly 401. In some embodiments, the redistribution structure 409 can include copper or other suitable conductive material.

As shown in FIG. 4D, multiple connectors 411 can be formed on and electrically coupled to the redistribution structure 409. The connectors 411 are further electrically coupled to the metallization structures of the semiconductor device packages and the base components in the individual semiconductor device package assemblies 401. In some embodiments, the connectors 411 can be ball grid array (BGA), including a solder ball, a pad, or other suitable connecting devices. The semiconductor device package assemblies 401 can then be "singulated" or separated by cutting through the encapsulant material 405 at the locations indicated by dashed lines shown in FIG. 4D.

FIGS. 5A-5D illustrate methods of processing semiconductor device package assemblies 501 in accordance with the present technology. In FIG. 5A, the semiconductor device package assemblies 501 are carried by a temporary carrier 503, and each of the semiconductor device package assemblies 501 has a face side 5011 and a back side 5013. In this embodiment, the face sides 5011 of the semiconductor device package assemblies 501 are coupled to the temporary carrier 503, as opposed to the back sides 5013 in FIGS. 4A and 4B. The semiconductor device package assemblies 501 are spaced apart such that they can later be separated during a singulation process.

FIG. 5B shows the assembly after the semiconductor device package assemblies 501 have been covered by an encapsulant material 505. In some embodiments, the encapsulant material 505 can include resin, plastic, silicon, oxide, polymer, or other suitable dielectric materials.

FIG. 5C shows the assembly after the temporary carrier 503 has been detached from the semiconductor device package assemblies 501. In FIG. 5C, the semiconductor device package assemblies 501 covered by the encapsulant material 505 are inverted compared to FIG. 5B.

FIG. 5D shows the assembly after a polymer layer 507 has been formed on the semiconductor device package assemblies 501. The method can include forming a redistribution structure 509 using the polymer structures 507. The redistribution structure 509 is electrically coupled to the metallization layers (e.g., the metallization structures 105 or 205) in individual semiconductor device package assembly 501. In some embodiments, the redistribution structure 509 can include copper or other suitable conductive material.

As shown in FIG. 5D, multiple connectors 511 can be formed on and electrically coupled to the redistribution structure 509. The connectors 511 are further electrically coupled to the metallization structures of the semiconductor device packages and the base components in the individual semiconductor device package assembly 501. In some embodiments, the connectors 511 can be BGA connectors that include a solder ball, a pad, or other suitable connecting devices. The semiconductor device package assemblies 501 can then be "singulated" or separated, by cutting through the encapsulant material 505 at the locations indicated by dashed lines shown in FIG. 5D.

Figure 6:
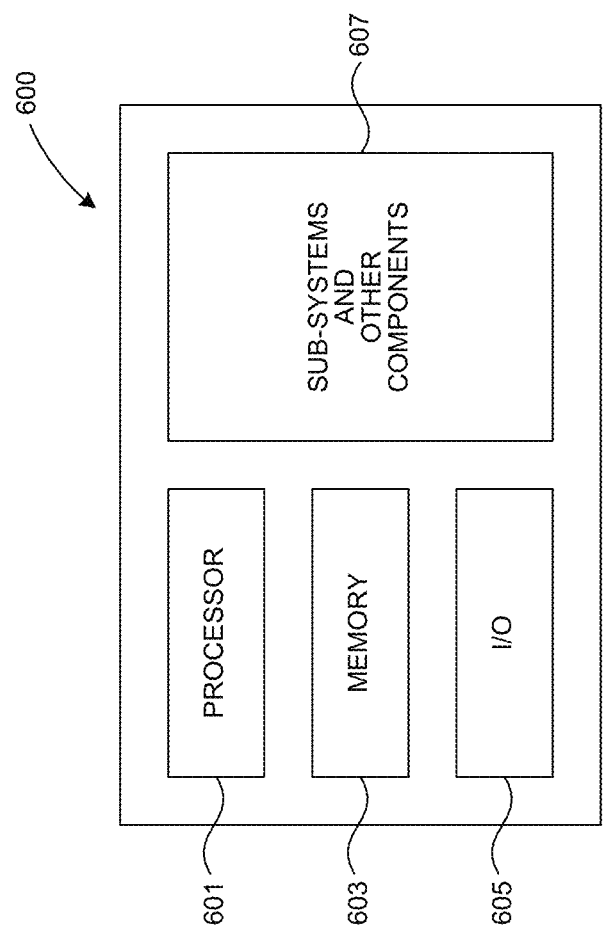
FIG. 6 is a block diagram illustrating a system that incorporates a semiconductor assembly in accordance with the present technology.

Any one of the semiconductor devices having the features described above with reference to FIGS. 1-5D can be incorporated into any of a myriad of larger and/or more complex systems, a representative example of which is a system 600 shown schematically in FIG. 6. The system 600 can include a processor 601, a memory 603 (e.g., SRAM, DRAM, flash, and/or other memory devices), input/output devices 605, and/or other subsystems or components 607. The semiconductor assemblies, devices, and device packages described above with reference to FIGS. 1-5D can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. With regard to these and other examples, the system 600 can be housed in a single unit or distributed over multiple interconnected units, e.g., through a communication network. The components of the system 600 can accordingly include local and/or remote memory storage devices and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

I claim:

1. A semiconductor device stacked die assembly, comprising:

a first semiconductor device die having a front side and a back side, the first semiconductor device die having a first metallization structure at the front side and a first substrate at the back side, the first metallization structure being exposed from the back side via a cavity;

a second semiconductor device die having a first side and a second side, the second semiconductor device die having a second metallization structure at the first side and a second substrate at the second side; and a metal pillar at least partially positioned in the cavity and electrically coupled to the second metallization structure and the first metallization structure, wherein the second metallization structure includes first, second and third metallization layers, and wherein the first metallization layer is electrically coupled to the metal pillar.

2. The semiconductor device stacked die assembly of claim 1, wherein the metal pillar includes indium.

3. The semiconductor device stacked die assembly of claim 1, wherein the metal pillar is a center metal pillar, and wherein the semiconductor device stacked die assembly further comprises a side metal pillar positioned at one side of the center metal pillar.

4. The semiconductor device stacked die assembly of claim 1, wherein a vertical dimension of the metal pillar is not more than 20 µm.

5. The semiconductor device stacked die assembly of claim 1, wherein a vertical dimension of the metal pillar is about 10 µm.

6. The semiconductor device stacked die assembly of claim 1, wherein the first metallization structure and the second metallization structure are electrically coupled through the metal pillar and exclusive of any through-silicon via (TSV).

7. The semiconductor device stacked die assembly of claim 1, wherein at least one of the first metallization structure and the second metallization structure includes aluminum.

8. The semiconductor device stacked die assembly of claim 1, wherein at least one of the first metallization structure and the second metallization structure includes copper.

9. The semiconductor device stacked die assembly of claim 1, wherein the first metallization layer includes aluminum, and wherein the second metallization layer includes copper, and wherein the third metallization layer includes copper.

10. A semiconductor device stacked die assembly, comprising:

a first semiconductor device die having a front side and a back side, the first semiconductor device die having a first metallization structure at the front side and a first substrate at the back side, the first metallization structure being exposed from the back side via a cavity;

a second semiconductor device die having a first side and a second side, the second semiconductor device die having a second metallization structure at the first side and a second substrate at the second side; and a metal pillar at least partially positioned in the cavity and electrically coupled to the second metallization structure and the first metallization structure, wherein the first metallization structure includes first, second and third metallization layers, and wherein the third metallization layer is electrically coupled to the metal pillar.

11. The semiconductor device stacked die assembly of claim 10, wherein the first metallization layer includes aluminum, and wherein the second metallization layer includes copper, and wherein the third metallization layer includes copper.

12. A semiconductor device stacked die assembly, comprising:

a first semiconductor device die having a front side and a back side, the first semiconductor device die having a first metallization structure at the front side and a first substrate at the back side, the first metallization structure being exposed from the back side via a cavity extending through the first substrate;

a second semiconductor device die having a first side and a second side, the second semiconductor device die having a second metallization structure at the first side and a second substrate at the second side; and a metal bump at least partially positioned in the cavity and directly physically and electrically coupled to the second metallization structure and the first metallization structure, wherein the second metallization structure includes first, second and third metallization layers, and wherein the first metallization layer is electrically coupled to the metal bump.

13. The semiconductor device stacked die assembly of claim 12, wherein the metal bump includes indium.

14. The semiconductor device stacked die assembly of claim 12, wherein the metal bump is a center metal bump, and wherein the semiconductor device stacked die assembly further comprises a side metal bump positioned at one side of the center metal bump.

15. The semiconductor device stacked die assembly of claim 12, wherein a vertical dimension of the metal bump is not more than 20 µm.

16. The semiconductor device stacked die assembly of claim 12, wherein a vertical dimension of the metal bump is about 10 µm.

17. The semiconductor device stacked die assembly of claim 12, wherein the first metallization structure and the second metallization structure are electrically coupled through the metal bump and exclusive of any through-silicon via (TSV).

18. The semiconductor device stacked die assembly of claim 12, wherein at least one of the first metallization structure and the second metallization structure includes aluminum or copper.

* * * * *